(12) United States Patent
Lee et al.

(10) Patent No.: US 12,376,432 B2
(45) Date of Patent: Jul. 29, 2025

(54) METHOD OF MANUFACTURING DISPLAY DEVICE AND DISPLAY DEVICE

(71) Applicant: Samsung Display Co., LTD., Yongin-si (KR)

(72) Inventors: Jong Chan Lee, Yongin-si (KR); Cheol Ku Kang, Yongin-si (KR); Hyun Kim, Yongin-si (KR); Jeong Su Park, Yongin-si (KR); Myeong Hun Song, Yongin-si (KR); Hyun Wook Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 547 days.

(21) Appl. No.: 17/699,426

(22) Filed: Mar. 21, 2022

(65) Prior Publication Data

US 2022/0328726 A1  Oct. 13, 2022

(30) Foreign Application Priority Data

Apr. 7, 2021 (KR) .................. 10-2021-0045458

(51) Int. Cl.
*H10H 20/831* (2025.01)
*H10H 20/01* (2025.01)
*H10H 20/857* (2025.01)

(52) U.S. Cl.
CPC ........ *H10H 20/8312* (2025.01); *H10H 20/01* (2025.01); *H10H 20/857* (2025.01); *H10H 20/032* (2025.01); *H10H 20/0364* (2025.01)

(58) Field of Classification Search
CPC ..... H01L 33/382; H01L 33/005; H01L 33/62; H01L 2933/0016; H01L 2933/0066;
(Continued)

(56) References Cited

U.S. PATENT DOCUMENTS 10,658,605 B2  5/2020  Lee et al.
11,239,215 B2  2/2022  Choi et al.
(Continued)

FOREIGN PATENT DOCUMENTS

KR  10-2018-0082003 A  7/2018
KR  10-2019-0029831 A  3/2019
(Continued)

OTHER PUBLICATIONS

International Search Report dated Jul. 13, 2022 issued in corresponding International Application No. PCT/KR2022/004726, 3 pages.

*Primary Examiner* — Timor Karimy
(74) *Attorney, Agent, or Firm* — Womble Bond Dickinson (US) LLP

(57) ABSTRACT

A manufacturing method of a display device and a display device are provided. A manufacturing method of a display device includes: preparing a substrate including a light emitting area and a non-light emitting area; arranging a first electrode, a second electrode, a first uncut electrode, and a second uncut electrode on the substrate; forming a bank in the non-light emitting area of the substrate; arranging a light emitting element in the light emitting area of the substrate; removing at least a portion of each of the first uncut electrode and the second uncut electrode; arranging a first contact electrode electrically connecting the light emitting element and the first electrode; and arranging a second contact electrode electrically connecting the light emitting element and the second electrode, and the at least the portion of each of the first uncut electrode and the second uncut electrode is removed within an open area.

5 Claims, 21 Drawing Sheets

(58) Field of Classification Search
CPC .. H10H 20/8312; H10H 20/01; H10H 20/857; H10H 20/0364; H10H 20/032
See application file for complete search history.

(56) References Cited

U.S. PATENT DOCUMENTS

| | | | |
|---|---|---|---|
| 2020/0005703 A1 | 1/2020 | Kim et al. | |
| 2020/0013841 A1 | 1/2020 | Lee | |
| 2022/0149244 A1* | 5/2022 | Lee | H01L 33/62 |

FOREIGN PATENT DOCUMENTS

| | | | |
|---|---|---|---|
| KR | 10-2019-0041012 | * | 4/2019 |
| KR | 10-2020-0001657 A | | 1/2020 |
| KR | 10-2020-0004482 A | | 1/2020 |
| KR | 10-2020-0078060 A | | 7/2020 |
| KR | 10-2020-0088962 A | | 7/2020 |
| KR | 10-2020-0118937 A | | 10/2020 |

* cited by examiner

METHOD OF MANUFACTURING DISPLAY DEVICE AND DISPLAY DEVICE

CROSS-REFERENCE TO RELATED APPLICATION

This application claims priority to and the benefit of Korean Patent Application No. 10-2021-0045458, filed on Apr. 7, 2021 in the Korean Intellectual Property Office, the entire content of which is incorporated herein by reference.

BACKGROUND

1. Field

Aspects of embodiments of the present invention relate to a method of manufacturing a display device, and a display device.

2. Description of the Related Art

Recently, as interest in an information display is increasing, research and development for display devices are continuously conducted.

SUMMARY

According to an aspect of embodiments of the present invention, a method of manufacturing a display device and a display device are provided, in which efficiency of an ink process for providing a light emitting element is improved.

According to another aspect of embodiments of the present invention, a method of manufacturing a display device and a display device are provided, in which a number of masks required for a process may be reduced, thereby reducing process costs.

However, aspects of embodiments of the present invention are not limited to those mentioned above, and other technical aspects and objects that are not mentioned may be clearly understood by a person of an ordinary skill in the art using the following description.

According to one or more embodiments of the present invention, a manufacturing method of a display device includes: preparing a substrate including a light emitting area and a non-light emitting area; arranging a first electrode, a second electrode, a first uncut electrode, and a second uncut electrode on the substrate; forming a bank in the non-light emitting area of the substrate; arranging a light emitting element in the light emitting area of the substrate; removing at least a portion of each of the first uncut electrode and the second uncut electrode; arranging a first contact electrode electrically connecting the light emitting element and the first electrode; and arranging a second contact electrode electrically connecting the light emitting element and the second electrode, wherein the light emitting area includes an open area and a contact area, the forming the bank includes surrounding, by the bank, at least a portion of the light emitting area, the arranging the first contact electrode and the second contact electrode includes electrically connecting, by the first contact electrode, the first electrode and the light emitting element in the contact area, and electrically connecting, by the second contact electrode, the second electrode and the light emitting element, and the at least the portion of each of the first uncut electrode and the second uncut electrode is removed within the open area.

The manufacturing method of the display device may further include arranging a bridge electrode electrically connecting the second contact electrode and the second electrode.

The manufacturing method of the display device may further include forming a first insulating film covering at least a portion of each of the first electrode, the second electrode, the first uncut electrode, and the second uncut electrode; forming a first contact hole overlapping the first electrode in the first insulating film in the contact area; and forming a second contact hole overlapping the second electrode in the first insulating film in the contact area, wherein the first contact hole may overlap the first electrode and the first contact electrode, and the second contact hole may overlap the second electrode, the bridge electrode, and the second contact electrode.

The manufacturing method of the display device may further include forming a second insulating film covering the first insulating film; and removing at least a portion of the second insulating film, wherein the second insulating film may surround the second contact hole, and at least a portion of the second insulating film may be covered by the bridge electrode.

The arranging the first contact electrode and the arranging the second contact electrode may be performed at different times; and the arranging the bridge electrode may be performed at a same time as the arranging the first contact electrode.

In the forming the first contact hole, the forming the second contact hole, and the removing the at least a portion of each of the first uncut electrode and the second uncut electrode, etching processes using a same mask may be performed.

The arranging the light emitting element may be performed before the forming the first contact hole and the forming the second contact hole.

The arranging the light emitting element may be performed before the removing the at least a portion of each of the first uncut electrode and the second uncut electrode.

The non-light emitting area may be defined as an area in which the bank is formed.

The arranging the light emitting element may further include providing on the substrate an ink including the light emitting element and a solvent in which the light emitting element is dispersed, and the ink may be provided in the light emitting area including the open area and the contact area.

The arranging the light emitting element may further include providing on the substrate an ink including the light emitting element and a solvent in which the light emitting element is dispersed, and the providing the ink may be performed before the removing the at least a portion of each of the first uncut electrode and the second uncut electrode, the forming the first contact hole, and the forming the second contact hole.

According to one or more embodiments of the present invention, a display device includes: a substrate including a light emitting area and a non-light emitting area; a first electrode and a second electrode arranged on the substrate; a light emitting element arranged on the light emitting area of the substrate and configured to emit light in a display direction; a first contact electrode and a second contact electrode electrically connected to the light emitting element; and a bank located on the non-light emitting area of the substrate and protruding in the display direction, wherein at least a portion of the light emitting area is surrounded by the non-light emitting area, and the light emitting area includes an open area and a contact area, the first electrode and the first contact electrode are electrically connected within the contact area, the second electrode and the second contact electrode are electrically connected within the contact area; and an end portion of the first electrode and an end portion of the second electrode are located within the open area.

The display device may further include a bridge electrode electrically connecting the second contact electrode and the second electrode.

The display device may further include a first insulating film covering at least a portion of each of the first electrode and the second electrode; and a first contact hole and a second contact hole penetrating the first insulating film in the contact area, wherein, in a plan view, the first contact electrode, the first contact hole, and the first electrode may overlap each other, and the second contact electrode, the second contact hole, the bridge electrode, and the second electrode may overlap each other.

The display device may further include a second insulating film of which at least a portion is arranged on the first insulating film, wherein the at least a portion of the second insulating film may surround the second contact hole when viewed in a plan view, and may be covered by the bridge electrode.

The bridge electrode may include a same material as the first contact electrode.

Aspects, objects, and solutions of the present invention are not limited to those described above, and aspects, objects, and solutions not mentioned will be clearly understood by a person of ordinary skill in the art from the present specification and the accompanying drawings.

According to an aspect of embodiment of the present invention, a method of manufacturing a display device and a display device are provided, in which efficiency of an ink process for providing a light emitting element is improved.

According to another aspect of embodiments of the present invention, a method of manufacturing a display device and a display device that may reduce a number of masks required for a process, and thereby reduce process costs, are provided.

However, aspects and effects of embodiments of the present invention are not limited to the above-described aspects and effects, and aspects and effects not mentioned will be clearly understood by a person of ordinary skill in the art from the present specification and the accompanying drawings.

DETAILED DESCRIPTION

Figure 1:
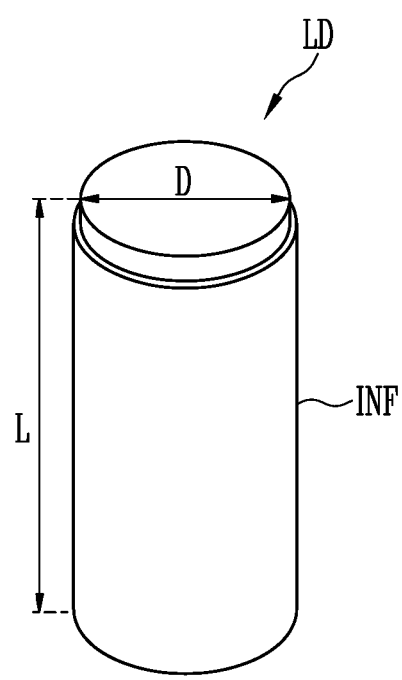
FIGS. 1 and 2 illustrate a perspective view and a cross-sectional view, respectively, of a light emitting element according to an embodiment.

The embodiments described in the present specification are intended to clearly explain the concept of the present invention to a person of ordinary skill in the art; however, it is to be understood that the present invention is not limited to the embodiments described in the present specification, and it will be understood by a person of ordinary skill in the art that various modifications and changes may be made without departing from the spirit and scope of the present invention.

The terms used in the present specification are selected as general terms that are currently widely used in consideration of the functions in the present invention, but these may vary according to the intention of a person of ordinary skill in the art to which the present invention belongs, practice, or new technologies. However, when a specific term is defined and used in an arbitrary meaning unlike this, the meaning of the term will be separately described. Therefore, the terms used in the present specification should be construed based on the actual meaning of the term and the overall contents of the present specification, not the nominal name of the term.

The accompanying drawings are provided in order to allow embodiments disclosed in the present specification to be easily understood, and the shapes shown in the drawings may be exaggerated and displayed so as to aid understanding of the present invention, and the present invention is not limited to the drawings.

In describing embodiments of the present invention, a detailed description of pertinent known configurations or functions may be omitted when deemed to make the gist of the present invention unnecessarily vague.

Embodiments of the present invention relate to a method of manufacturing a display device and a display device. Herein, a method of manufacturing a display device and a display device according to one or more embodiments will be described with reference to FIGS. 1 to 21.

Figure 2:
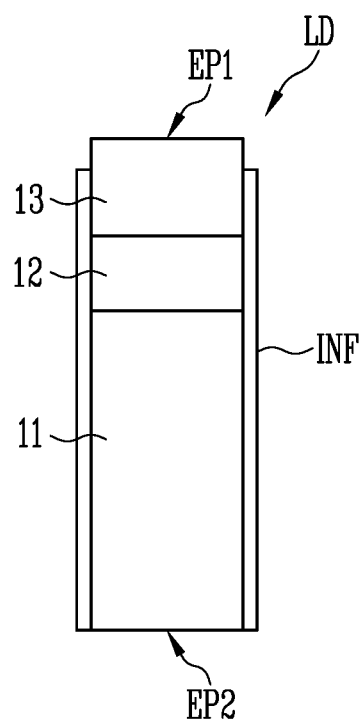

FIGS. 1 and 2 illustrate a light emitting element LD included in a display device according to an embodiment. FIGS. 1 and 2 illustrate a perspective view and a cross-sectional view, respectively, of a light emitting element according to an embodiment. FIGS. 1 and 2 illustrate a cylindrical shaped light emitting element LD, but a type and/or shape of the light emitting element LD is not limited thereto.

Referring to FIGS. 1 and 2, the light emitting element LD may include a first semiconductor layer 11 and a second semiconductor layer 13, and an active layer 12 interposed between the first and second semiconductor layers 11 and 13. For example, when an extending direction of the light emitting element LD is referred to as a length L direction, the light emitting element LD may include the first semiconductor layer 11, the active layer 12, and the second semiconductor layer 13 sequentially stacked along the length L direction.

In an embodiment, the light emitting element LD may be provided to have a cylindrical shape extending along a direction. The light emitting element LD may have a first end portion EP1 and a second end portion EP2. One of the first and second semiconductor layers 11 and 13 may be adjacent to the first end portion EP1 of the light emitting element LD, and the other one of the first and second semiconductor layers 11 and 13 may be adjacent to the second end portion EP2 of the light emitting element LD.

In some embodiments, the light emitting element LD may be a light emitting element manufactured in a cylindrical shape through an etching method or the like. In the present specification, "cylindrical shape" includes a rod-like shape or bar-like shape (that is, with an aspect ratio greater than 1) that is long in the length L direction, such as a circular cylinder or a polygonal cylinder, but a shape of a cross-section thereof is not particularly limited. For example, the length L of the light emitting element LD may be larger than a diameter D thereof (or a width of a lateral cross-section thereof).

The light emitting element LD may have a size as small as a nanometer scale to a micrometer scale. For example, the light emitting element LD may have the diameter D (or width) and/or the length L in a range from a nano scale to a micro scale. However, the size of the light emitting element LD is not limited thereto, and the size of the light emitting element LD may be variously changed according to design conditions of various devices using a light emitting device using the light emitting element LD as a light source, for example, a display device.

The first semiconductor layer 11 may be a first conductive semiconductor layer. For example, the first semiconductor layer 11 may include an N-type semiconductor layer. For example, the first semiconductor layer 11 may include a semiconductor material of any of InAlGaN, GaN, AlGaN, InGaN, AlN, and InN, and may include a N-type semiconductor layer doped with a first conductive dopant, such as Si, Ge, Sn, or the like. However, the material included in the first semiconductor layer 11 is not limited thereto, and the first semiconductor layer 11 may be made of any of various materials.

The active layer 12 is disposed on the first semiconductor layer 11, and may be formed to have a single-quantum or multi-quantum well structure. A position of the active layer 12 may be variously changed according to a type of the light emitting element LD.

A clad layer (not shown) doped with a conductive dopant may be formed at an upper portion and/or a lower portion of the active layer 12. For example, the clad layer may be formed as an AlGaN layer or an InAlGaN layer. In some embodiments, a material such as AlGaN and InAlGaN may be used to form the active layer 12, and any of various materials may form the active layer 12.

The second semiconductor layer 13 is disposed on the active layer 12, and may include a semiconductor layer of a type different from that of the first semiconductor layer 11. For example, the second semiconductor layer 13 may include a P-type semiconductor layer. For example, the second semiconductor layer 13 may include at least one semiconductor material of InAlGaN, GaN, AlGaN, InGaN, AlN, and InN, and may include a P-type semiconductor layer doped with a second conductive dopant, such as Mg. However, the material included in the second semiconductor layer 13 is not limited thereto, and the second semiconductor layer 13 may be formed of any of various materials.

When a voltage of a threshold voltage or more is applied to respective ends of the light emitting element LD, the light emitting device LD emits light while electron-hole pairs are combined in the active layer 12. By controlling the light emission of the light emitting element LD by using this principle, the light emitting element LD may be used as a light source for any of various light emitting devices in addition to pixels of a display device.

In an embodiment, the light emitting element LD may further include an insulating film INF provided on a surface thereof. The insulating film INF may be formed on the surface of the light emitting device LD so as to surround at least an outer circumferential surface of the active layer 12, and may further surround an area of the first and second semiconductor layers 11 and 13. The insulating film INF may be formed as a single film or a double film, but is not limited thereto, and may be formed as a plurality of films. For example, the insulating film INF may include a first insulating film including a first material and a second insulating film including a second material different from the first material.

In some embodiments, the insulating film INF may expose respective end portions of the light emitting element LD having different polarities. For example, the insulating film INF may expose an end of each of the first and second semiconductor layers 11 and 13 disposed at the first and second end portions EP1 and EP2 of the light emitting element LD. In another embodiment, the insulating film INF may expose side portions of the first and second semiconductor layers 11 and 13 adjacent to the first and second end portions EP1 and EP2 of the light emitting element LD having different polarities.

In some embodiments, the insulating film INF may be formed as a single layer or multilayer (for example, a double layer made of an aluminum oxide (AlOx) and a silicon oxide (SiOx)) by including at least one insulating material of a silicon oxide (SiOx), a silicon nitride (SiNx), a silicon oxynitride (SiOxNy), an aluminum oxide (AlOx), and a titanium oxide (TiOx), but is not limited thereto. In some embodiments, the insulating film INF may be omitted.

When the insulating film INF is provided to cover the surface of the light emitting element LD, particularly the outer circumferential surface of the active layer 12, electrical stability of the light emitting element LD may be secured.

In addition, when the insulating film INF is provided on the surface of the light emitting element LD, it is possible to improve life span and efficiency thereof by minimizing or reducing surface defects of the light emitting element LD. In addition, it is possible to prevent or substantially prevent an unwanted short circuit between the light emitting elements LD from occurring even when a plurality of light emitting elements LD are disposed in close contact with each other.

In an embodiment, the light emitting element LD may further include an additional constituent element in addition to the first semiconductor layer 11, the active layer 12, the second semiconductor layer 13, and/or the insulating film INF. For example, the light emitting element LD may additionally include one or more of a phosphor layer, an active layer, a semiconductor layer, and/or an electrode layer disposed on an end side of the first semiconductor layer 11, the active layer 12, and/or the second semiconductor layer 13. For example, a contact electrode layer may be respectively disposed at the first and second end portions EP1 and EP2 of the light emitting element LD.

A light emitting device including the light emitting element LD described above may be used in various types of devices that require a light source in addition to a display device. For example, a plurality of light emitting elements LD may be disposed in each pixel of a display panel, and the light emitting elements LD may be used as a light source of each pixel. However, an application field of the light emitting element LD is not limited to the above-described example. For example, the light emitting element LD may be used in other types of devices that require a light source, such as a lighting device.

Figure 3:
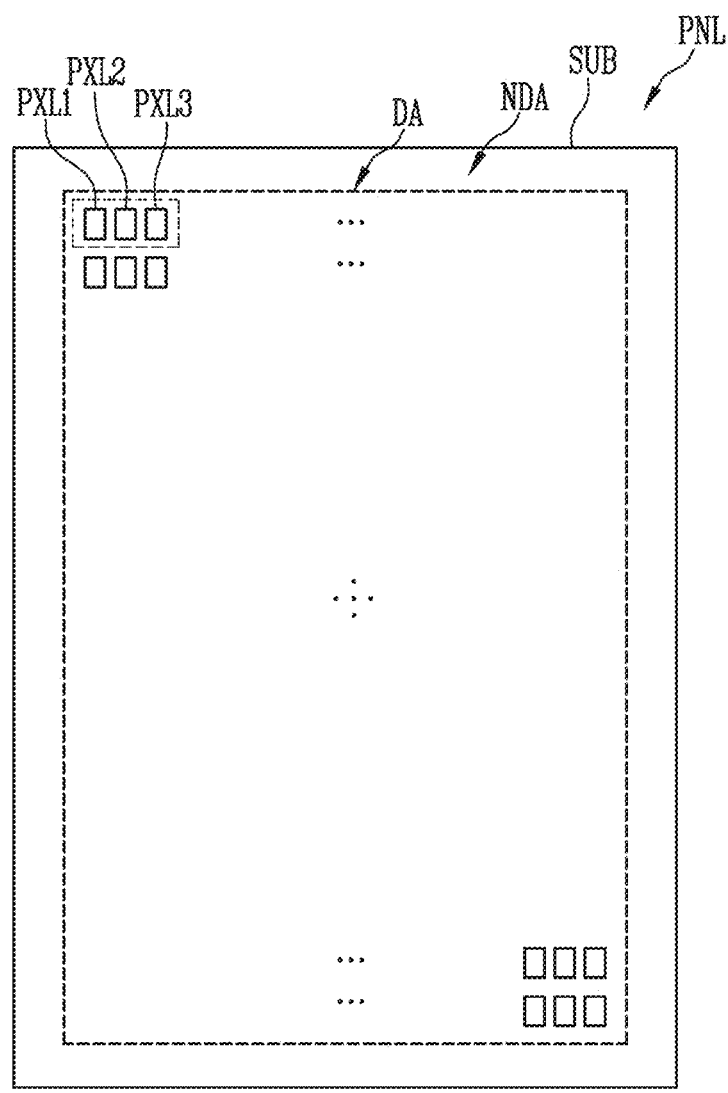
FIG. 3 illustrates a top plan view of a display device according to an embodiment.

FIG. 3 illustrates a top plan view of a display device according to an embodiment.

FIG. 3 illustrates a display device, in particular, a display panel PNL provided in the display device as an example of an electronic device that may use the light emitting element LD described in the embodiments of FIGS. 1 and 2 as a light source.

Each pixel unit PXU of the display panel PNL and each pixel configuring the same may include at least one light emitting element LD. For convenience, FIG. 3 briefly illustrates a structure of the display panel PNL based on a display area DA. However, in some embodiments, at least one driving circuit portion (for example, at least one of a scan driver and a data driver), wires, and/or pads, which are not shown, may be further disposed in the display panel PNL.

Referring to FIG. 3, the display panel PNL may include a substrate SUB and the pixel unit PXU disposed on the substrate SUB. The pixel unit PXU may include a first pixel PXL1, a second pixel PXL2, and/or a third pixel PXL3. Herein, when arbitrarily referring to at least one of the first pixel PXL1, the second pixel PXL2, and the third pixel PXL3, or when comprehensively referring to two or more thereof, they will be referred to as a "pixel PXL" or "pixels PXL."

The substrate SUB configures a base member of the display panel PNL, and may be a rigid or flexible substrate or film. For example, the substrate SUB may be a hard substrate made of glass or tempered glass, a flexible substrate (or a thin film) made of a plastic or metallic material, or at least one layered insulating layer, but is not limited thereto.

The display panel PNL and the substrate SUB for forming the display panel include a display area DA for displaying an image and a non-display area NDA excluding the display area DA.

The pixels PXL may be disposed in the display area DA. In the non-display area NDA, various wires connected to the pixels PXL of the display area DA, pads, and/or internal circuit parts may be disposed. The pixels PXL may be regularly arranged according to a stripe or PENTILE™ arrangement structure. However, the arrangement structure of the pixels PXL is not limited thereto, and the pixels PXL may be arranged in the display area DA in any of various structures and/or methods.

In some embodiments, two or more types of pixels PXL emitting light of different colors may be disposed in the display area DA. For example, in the display area DA, the first pixels PXL1 emitting light of a first color, the second pixels PXL2 emitting light of a second color, and the third pixels PXL3 emitting light of a third color may be arranged. At least one first to third pixels PXL1, PXL2, and PXL3 disposed to be adjacent to each other may form one pixel unit PXU that may emit light of various colors. For example, each of the first to third pixels PXL1, PXL2, and PXL3 may be a sub-pixel that emits light of a certain color (e.g., a predetermined color). In some embodiments, the first pixel PXL1 may be a red pixel that emits red light, the second pixel PXL2 may be a green pixel that emits green light, and the third pixel PXL3 may be a blue pixel that emits blue light, but the present invention is not limited thereto.

In an embodiment, the first pixel PXL1, the second pixel PXL2, and the third pixel PXL3 are each provided with a first color light emitting element, a second color light emitting element, and a third color light emitting element as a light source, respectively, such that they respectively emit light of the first color, second color, and third color. In another embodiment, the first pixel PXL1, the second pixel PXL2, and the third pixel PXL3 are provided with light emitting elements of the same color, and include color conversion layers and/or color filters of different colors disposed on respective light emitting elements, such that they may emit light of the first color, the second color, and the third color, respectively. However, the color, type, and/or number of pixels PXL configuring each pixel unit PXU are not particularly limited. That is, the color of light emitted by each pixel PXL may be variously changed.

The pixel PXL may include at least one light source driven by a control signal (e.g., a predetermined control signal) (for example, a scan signal and a data signal) and/or a power source (e.g., a predetermined power source). In an embodiment, the light source may include at least one light emitting device LD according to one of the embodiments of FIGS. 1 and 2, for example, ultra-small cylindrical shaped light emitting elements LD having a size as small as nanometer scale to micrometer scale. However, the present invention is not limited thereto, and any of various types of light emitting elements LD may be used as a light source of the pixel PXL.

In an embodiment, each pixel PXL may be configured as an active pixel. However, the type, structure, and/or driving method of pixels PXL that may be applied to the display device are not particularly limited. For example, each pixel PXL may be configured as a pixel of a passive or active light emitting display device of various structures and/or driving methods.

Herein, a pixel PXL according to some embodiment will be described in further detail with reference to FIGS. 4 to 7. FIGS. 4 to 7 illustrate top plan views of a pixel according to some embodiments.

Figure 4:
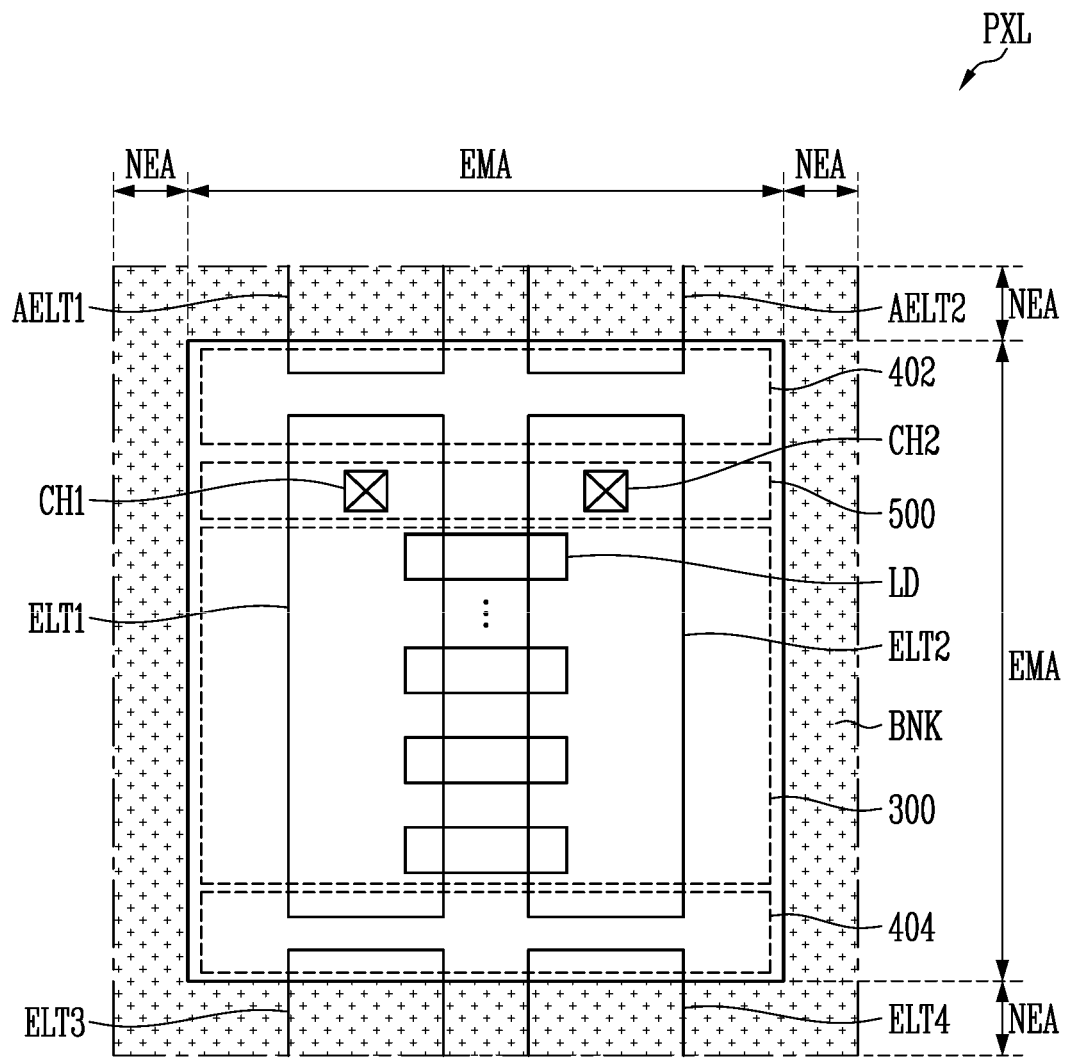
FIGS. 4 to 7 illustrate top plan views of a pixel according to some embodiments.

FIG. 4 illustrates a schematic top plan view of an organic connection relationship between individual components of the pixel PXL according to an embodiment, and illustrations of some components included in the pixel PXL are omitted for better understanding and ease of description. The pixel PXL illustrated in FIG. 4 may be at least one of the first pixel PXL1, the second pixel PXL2, and the third pixel PXL3, which are described with reference to FIG. 3.

Referring to FIG. 4, the pixel PXL according to an embodiment may include a light emitting area EMA and a non-light emitting area NEA. According to an embodiment, the light emitting area EMA may include an arrangement area 300, an open area 400, and a contact area 500.

The light emitting area EMA may refer to an area in which light is emitted. The light emitting area EMA may refer to an area in which a bank BNK is not arranged. The light emitting element LD may be disposed in the light emitting area EMA.

The non-light emitting area NEA may refer to an area in which light is not emitted. The non-light emitting area NEA may refer to an area in which the bank BNK is arranged. The non-light emitting area NEA may surround at least a portion of the light emitting area EMA. The non-light emitting area NEA may be provided in a shape surrounding the light emitting area EMA when viewed in a plan view. The light emitting element LD may not be disposed in the non-light emitting area NEA.

The arrangement area 300 is an area within the light emitting area EMA, and may refer to an area in which the light emitting elements LD are arranged. According to an embodiment, the arrangement area 300 may include the open area 400 of the light emitting area EMA and at least a portion of an area other than the contact area 500. According to an example, the arrangement area 300 may be disposed between a first open area 402 and a second open area 404 that are included in the open area 400. The arrangement area 300 may be disposed between the second open area 404 and the contact area 500.

The open area 400 is an area within the light emitting area EMA, and may include an area in which a cutting process for an electrode configuration is performed to provide one of first to eighth electrodes ELT1 to ELT8 as a pixel electrode. For example, referring to FIG. 4, at least a portion of the electrode configuration is removed from the open area 400, such that the first electrode ELT1, the second electrode ELT2, the third electrode ELT3, the fourth electrode ELT4, a first adjacent electrode AELT1, and a second adjacent electrode. AELT2 may be provided.

According to an embodiment, the open area 400 may include the first open area 402 and the second open area 404. According to an example, the first open area 402 may be disposed at a side of the arrangement area 300, and the second open area 404 may be disposed at another side of the arrangement area 300. Accordingly, the arrangement area 300 may be disposed between the first open area 402 and the second open area 404.

According to an embodiment, the first open area 402 may be disposed at a side of the contact area 500, and the second open area 404 may be disposed at another side of the contact area 500. Accordingly, the contact area 500 may be disposed between the first open area 402 and the second open area 404.

According to an embodiment, the open area 400 may be disposed in an area in which the bank BNK is not arranged, and may be adjacent to an area in which the light emitting elements LD are arranged.

The contact area 500 is an area within the light emitting area EMA, and may overlap an area in which a first contact hole CH1 and a second contact hole CH2 are respectively arranged when viewed in a plan view. The first contact hole CH1 and the second contact hole CH2 may be disposed within the contact area 500. According to an example, the contact area 500 may be disposed adjacent to a side of the arrangement area 300. The contact area 500 may be disposed between the first open area 402 and the second open area 404. The contact area 500 may be disposed between the first open area 402 and the arrangement area 300.

Figure 5:
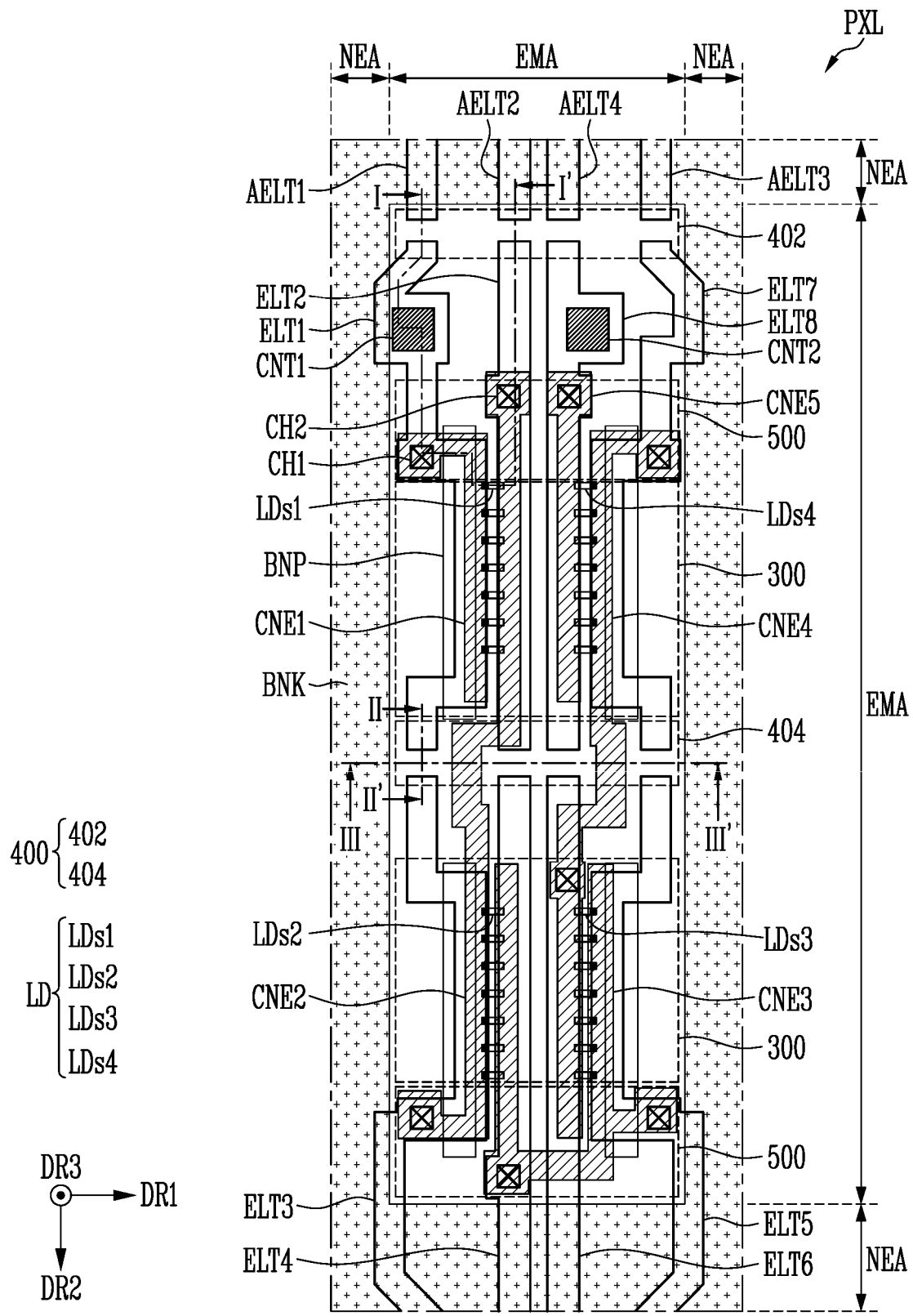

Herein, a pixel PXL according to an embodiment will be described with reference to FIG. 5. FIG. 5 illustrates a top plan view of a pixel PXL according to an embodiment. FIG. 5 illustrates a structure in which the light emitting element LD includes first to fourth light emitting elements LDs1 to LDs4. The pixel PXL illustrated in FIG. 5 may be at least one of the first pixel PXL1, the second pixel PXL2, and the third pixel PXL3, which are described with reference to FIG. 3.

Referring to FIG. 5, the pixel PXL according to an embodiment includes the first to eighth electrodes ELT1 to ELT8, the first to fourth adjacent electrodes AELT1 to AELT4, the light emitting elements LD, the bank BNK, and a bank pattern BNP. In this case, the light emitting elements LD may include the first to fourth light emitting elements LDs1 to LDs4. The first light emitting element LDs1 may be disposed between the first electrode ELT1 and the second electrode ELT2. The second light emitting element LDs2 may be disposed between the third electrode ELT3 and the fourth electrode ELT4. The third light emitting element LDs3 may be disposed between the fifth electrode ELT5 and the sixth electrode ELT6. The fourth light emitting element LDs4 may be disposed between the seventh electrode ELT7 and the eighth electrode ELT8.

The light emitting elements LD may be arranged in the light emitting area EMA. The first to fourth light emitting elements LDs1 to LDs4 may be disposed within the light emitting area EMA when viewed in a plan view. The light emitting elements LD may be disposed within the arrangement area 300 that is a portion of the light emitting area EMA.

Each of the first to fourth light emitting elements LDs1 to LDs4 may be arranged along a second direction DR2 when viewed in a plan view. For example, the first light emitting element LDs1 may include a plurality of light emitting elements, and each first light emitting element LDs1 may be disposed in the arrangement area 300 along the second direction DR2.

Among the first to eighth electrodes ELT1 to ELT8, a pair of electrodes configuring each series stage may be disposed adjacent to an area in which the light emitting element LD is arranged. The first to eighth electrodes ELT1 to ELT8 may extend along the second direction DR2, respectively, and may be disposed to be spaced apart from each other along a first direction DR1.

At least a portion of each of the first to eighth electrodes ELT1 to ELT8 may be arranged on the bank pattern BNP. According to an example, the first electrode ELT1 and the second electrode ELT2 may be arranged on the bank pattern BNP, and, in this case, the first electrode ELT1 and the second electrode ELT2 may reflect light emitted from the light emitting element LD by the bank pattern BNP, and, thus, light emitting luminous efficiency of the pixel PXL may be improved.

The first to eighth electrodes ELT1 to ELT8 may be the pixel electrodes of each pixel PXL. A portion of one of the first to eighth electrodes ELT1 to ELT8 may be formed as an alignment wire, and then may be cut off in the open area 400 to be separated into respective pixel electrodes.

For example, the first electrode ELT1, which is one of the pixel electrodes, may be provided by arranging an uncut electrode configuration and then removing at least a portion of the electrode configuration disposed in the open area 400. Accordingly, the first electrode ELT1 may function as a pixel electrode for the first light emitting element LDs1, and may be electrically connected to a transistor (see "Tr" in FIG. 8) through a first contact portion CNT1. The eighth electrode ELT8 may also be provided by arranging an uncut electrode configuration and then removing at least a portion of the electrode configuration disposed in the open area 400. Accordingly, the eighth electrode ELT8 may function as a pixel electrode for the fourth light emitting element LDs4, and may be electrically connected to another transistor through a second contact portion CNT2.

According to an embodiment, after the electrode configuration is arranged, at least a portion of the electrode configuration arranged in the first open area 402 is removed, such that the first electrode ELT1 and the first adjacent electrode AELT1 may be separated, the second electrode ELT2 and the second adjacent electrode AELT2 may be separated, the seventh electrode ELT7 and the third adjacent electrode AELT3 may be separated, and the eighth electrode ELT8 and the fourth adjacent electrode AELT4 may be separated.

In addition, according to an embodiment, after the electrode configuration is arranged, another at least a portion of the electrode configuration arranged in the second open area 404 is removed, such that the first electrode ELT1 and the third electrode ELT3 may be separated, the second electrode ELT2 and the fourth electrode ELT4 may be separated, the seventh electrode ELT7 and the fifth electrode ELT5 may be separated, and the eighth electrode ELT8 and the sixth electrode ELT6 may be separated.

According to an embodiment, the first to eighth electrodes ELT1 to ELT8 may be connected to the light emitting element LD through a contact electrode (for example, first to fifth contact electrodes CNE1 to CNE5).

According to an embodiment, the first light emitting element LDs1, the second light emitting element LDs2, the third light emitting element LDs3, and the fourth light emitting element LDs4 may be connected in series.

The first contact electrode CNE1 may be disposed on the first light emitting element LDs1 and the first electrode ELT1 of the first serial stage to connect the first light emitting element LDs1 of the first serial stage to the first electrode ELT1.

The second contact electrode CNE2 may be disposed on the first light emitting element LDs1 and the second electrode ELT2 of the first serial stage to connect the first light emitting element LDs1 of the first serial stage to the second electrode ELT2. In addition, the second contact electrode CNE2 may be disposed on the second light emitting element LDs2 and the third electrode ELT3 of the second serial stage to connect the second light emitting element LDs2 of the second serial stage to the third electrode ELT3.

The third contact electrode CNE3 may be disposed on the second light emitting element LDs2 and the fourth electrode ELT4 of the second serial stage to connect the second light emitting element LDs2 of the second serial stage to the fourth electrode ELT4. In addition, the third contact electrode CNE3 may be disposed on the third light emitting element LDs3 and the fifth electrode ELT5 of the third serial stage to connect the third light emitting element LDs3 of the third serial stage to the fifth electrode ELT5.

The fourth contact electrode CNE4 may be disposed on the third light emitting element LDs3 and the sixth electrode ELT6 of the third serial stage to connect the third light emitting element LDs3 of the third serial stage to the sixth electrode ELT6. In addition, the fourth contact electrode CNE4 may be disposed on the fourth light emitting element LDs4 and the seventh electrode ELT7 of the fourth serial stage to connect the fourth light emitting element LDs4 of the fourth serial stage to the seventh electrode ELT7.

The fifth contact electrode CNE5 may be disposed on the fourth light emitting element LDs4 and the eighth electrode ELT8 of the fourth serial stage to connect the fourth light emitting element LDs4 of the fourth serial stage to the eighth electrode ELT8.

Figure 6:
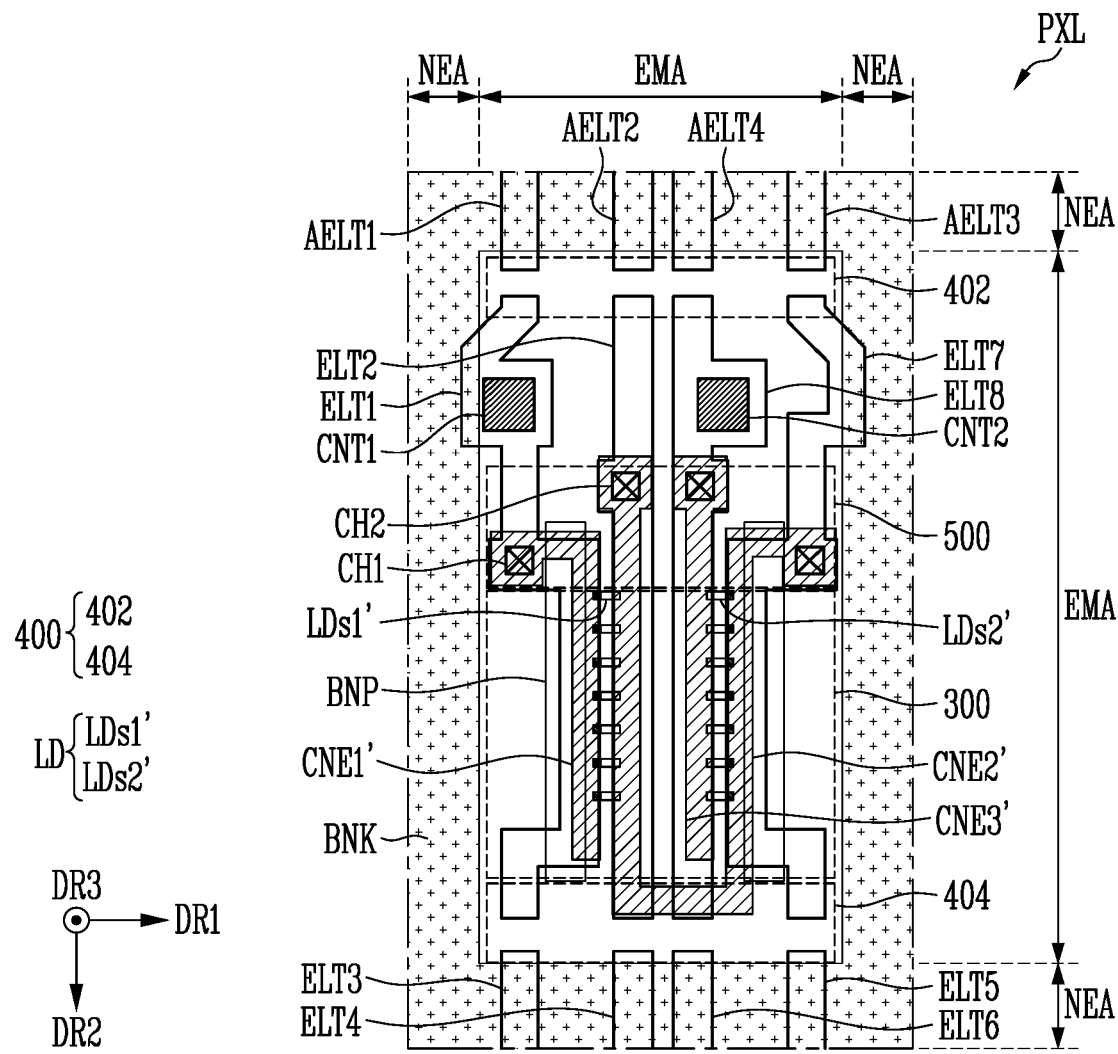

However, the structure of the pixel PXL according to one or more embodiments is not limited to the structure shown in FIG. 5. A pixel PXL according to another embodiment will be described with reference to FIG. 6. FIG. 6 illustrates a top plan view of a pixel PXL according to another embodiment. Contents that may be redundant with the above-described contents may be omitted or simplified.

According to the present embodiment, a first light emitting element LDs1' and a second light emitting element LDs2' may be connected in series. The first light emitting elements LDs1' and the second light emitting elements LDs2' may be disposed in the arrangement area 300.

According to an embodiment, an end of the first light emitting element LDs1' may be connected to the first electrode ELT1 through a first contact electrode CNE1', and another end of the first light emitting element LDs1' may be connected to the second electrode ELT2 through a second contact electrode CNE2'.

An end of the second light emitting element LDs2' may be connected to the seventh electrode ELT7 through the second contact electrode CNE2', and another end of the second light emitting element LDs2' may be connected to the eighth electrode ELT8 through a third contact electrode CNE3'.

Figure 7:
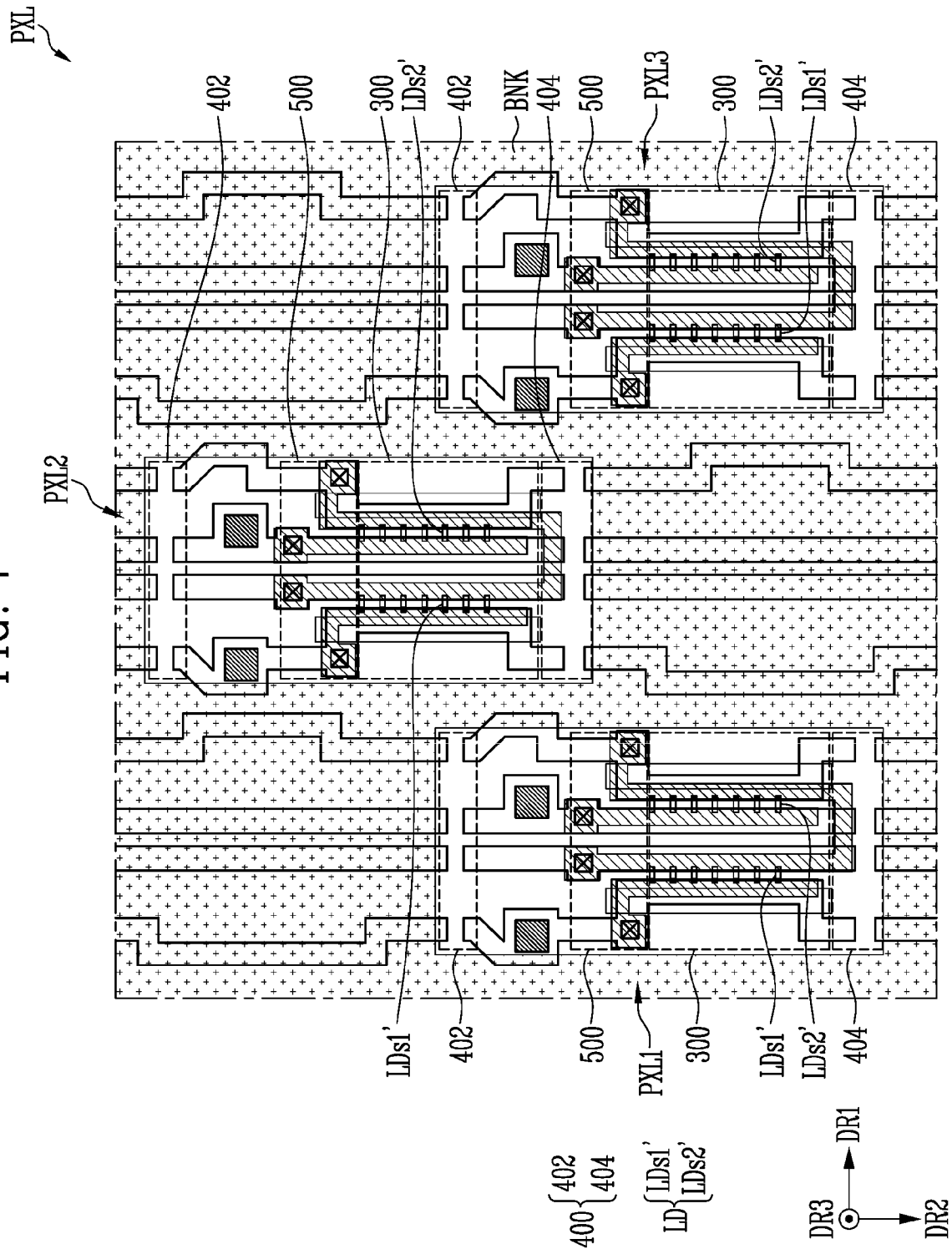

A pixel PXL according to another embodiment will be described with reference to FIG. 7. FIG. 7 illustrates a top plan view of a pixel PXL according to another embodiment. In FIG. 7, for better comprehension and ease of description, some of reference numerals are omitted and illustrated.

According to an embodiment, the first pixel PXL1, the second pixel PXL2, and the third pixel PXL3 included in the pixel PXL may be disposed to be staggered. The first pixel PXL1, the second pixel PXL2, and the third pixel PXL3 may be disposed such that at least some of them are shifted in a pixel row direction (for example, first direction DR1).

According to an embodiment, each of the first pixel PXL1, the second pixel PXL2, and the third pixel PXL3 shown in FIG. 7 may have the structure of the pixel PXL shown in FIG. 6. For example, each of the first pixel PXL1, the second pixel PXL2, and the third pixel PXL3 may have a structure in which the first light emitting elements LDs1' and the second light emitting elements LDs2' are disposed in series. In addition, each of the first pixel PXL1, the second pixel PXL2, and the third pixel PXL3 may include the arrangement area 300, the open area 400, and the contact area 500. In this case, the open area 400 may include, as described above, the first open area 402 disposed at a side of the arrangement area 300 and the second open area 404 disposed at another side of the arrangement area 300.

According to an embodiment, the light emitting element LD included in each of the first pixel PXL1, the second pixel PXL2, and the third pixel PXL3 may include the first light emitting element LDs1' and the second light emitting element LDs2', and each of the first light emitting element LDs1' and the second light emitting element LDs2' may be disposed in a channel (e.g., a predetermined channel).

According to an embodiment, the light emitting area EMA of the first pixel PXL1 and the light emitting area EMA of the third pixel PXL3 may overlap in a pixel row direction. According to an example, the pixel row direction may refer to the first direction DR1.

According to an embodiment, at least a portion of the light emitting area EMA of the first pixel PXL1 may not overlap the light emitting area EMA of the second pixel PXL2 in the pixel row direction. At least a portion of the light emitting area EMA of the second pixel PXL2 may not overlap the light emitting area EMA of each of the first pixel PXL1 and the third pixel PXL3 in the pixel row direction. At least a portion of the light emitting area EMA of the third pixel PXL3 may not overlap the light emitting area EMA of the second pixel PXL2 in the pixel row direction. Here, the light emitting area EMA of each of the first to third pixels PXL1 to PXL3 may refer to an area including the arrangement area 300, the open area 400, and the contact area 500, which are areas surrounded by the bank BNK.

However, the structure of the pixel PXL according to one or more embodiments is not limited to the above-described examples, and, in some embodiments, the pixel PXL including various electrode connection structures may be provided.

Figure 8:
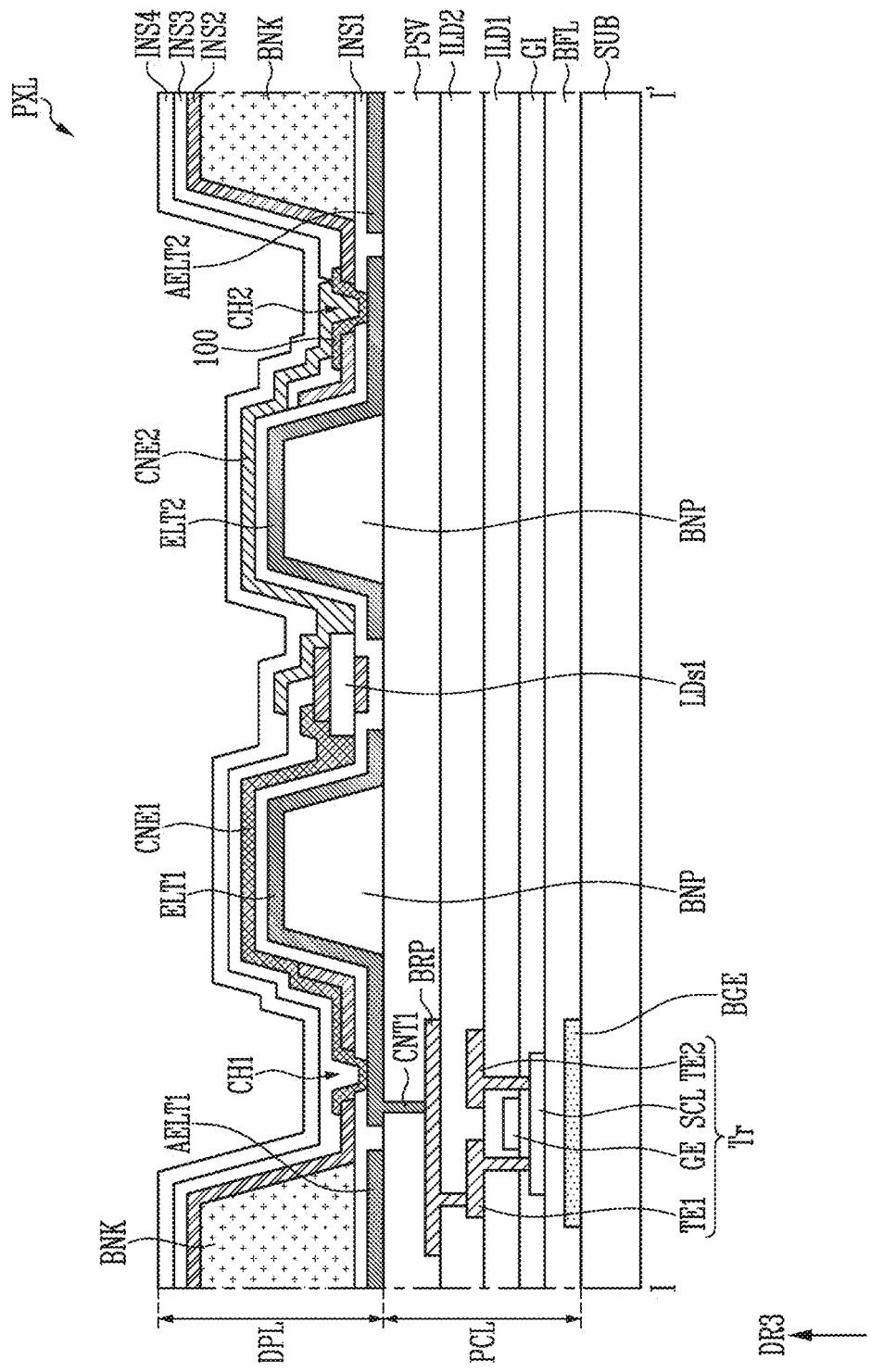
FIG. 8 illustrates a cross-sectional view taken along the line I-I' of FIG. 5.

FIG. 8 illustrates a cross-sectional view taken along the line I-I' of FIG. 5. In FIG. 8, the arrangement area 300, the first open area 402, and the contact area 500 of the light emitting area EMA are shown, and a partial structure of the non-light emitting area NEA is shown.

Referring to FIG. 8, the pixel PXL according to an embodiment may include the substrate SUB, a pixel circuit part PCL, and a display element part DPL. In FIG. 8, for better understanding and ease of description, the first light emitting element LDs1 among the light emitting elements LD is described as an example.

The substrate SUB may form a base surface of the pixel PXL. The substrate SUB may be a rigid or flexible substrate. According to an example, the substrate SUB may include a rigid material or a flexible material, but is not limited to a specific example.

The pixel circuit part PCL may include a buffer film BFL, a back gate electrode BGE, a transistor Tr, a gate insulating film GI, a first interlayer insulating film ILD1, a second interlayer insulating film ILD2, a bridge pattern BRP, a first contact portion CNT1, and a passivation film PSV.

The buffer film BFL may be disposed on the substrate SUB. The buffer film BFL may prevent or substantially prevent impurities from being diffused from the outside. The buffer film BFL may include at least one of metal oxides, such as a silicon nitride (SiNx), a silicon oxide (SiOx), a silicon oxynitride (SiOxNy), and an aluminum oxide (AlOx).

The back gate electrode BGE may be disposed on the substrate SUB. The back gate electrode BGE may overlap a gate electrode GE when viewed in a plan view.

The transistor Tr may be a thin film transistor. According to an example, the transistor Tr may be a driving transistor. The transistor Tr may include a semiconductor layer SCL, a first transistor electrode TE1, a second transistor electrode TE2, and a gate electrode GE.

The semiconductor layer SCL may be disposed on the buffer film BFL. The semiconductor layer SCL may include at least one of polysilicon, amorphous silicon, and an oxide semiconductor.

The semiconductor layer SCL may include a first contact area in contact with the first transistor electrode TE1 and a second contact area in contact with the second transistor electrode TE2. The first contact area and the second contact area may be a semiconductor pattern doped with an impurity. An area between the first contact area and the second contact area may be a channel area. The channel area may be an intrinsic semiconductor pattern in which no impurity is doped.

The gate insulating film GI may be provided on the semiconductor layer SCL. The gate insulating film GI may include an inorganic material. According to an embodiment, the gate insulating film GI may include at least one of a silicon nitride (SiNx), a silicon oxide (SiOx), a silicon oxynitride (SiOxNy), and an aluminum oxide (AlOx). In some embodiments, the gate insulating film GI may include an organic material.

The gate electrode GE may be disposed on the gate insulating film GI. A position of the gate electrode GE may correspond to a position of the channel area of the semiconductor layer SCL. For example, the gate electrode GE may be disposed on the channel area of the semiconductor layer SCL with the gate insulating film GI interposed therebetween.

The first interlayer insulating film ILD1 may be disposed on the gate electrode GE. Like the gate insulating film GI, the first interlayer insulating film ILD1 may include at least one of a silicon nitride (SiNx), a silicon oxide (SiOx), a silicon oxynitride (SiOxNy), and an aluminum oxide (AlOx).

The first transistor electrode TE1 and the second transistor electrode TE2 may be disposed on the first interlayer insulating film ILD1. The first transistor electrode TE1 may pass through the gate insulating film GI and the first interlayer insulating film ILD1 to contact the first contact area of the semiconductor layer SCL, and the second transistor electrode TE2 may pass through the gate insulating film GI and the first interlayer insulating film ILD1 to contact the second contact area of the semiconductor layer SCL. According to an embodiment, the first transistor electrode TE1 may be a source electrode, and the second transistor electrode TE2 may be a drain electrode, but the present invention is not limited thereto.

The second interlayer insulating film ILD2 may be disposed on the first transistor electrode TE1 and the second transistor electrode TE2. Like the first interlayer insulating film ILD1 and the gate insulating film GI, the second interlayer insulating film ILD2 may include an inorganic material. The inorganic material may include at least one of materials described as constituent materials of the first interlayer insulating film ILD1 and the gate insulating film GI, for example, a silicon nitride (SiNx), a silicon oxide (SiOx), a silicon oxynitride (SiOxNy), and an aluminum oxide AlOx. In some embodiments, the second interlayer insulating film ILD2 may include an organic material.

The bridge pattern BRP may be disposed on the second interlayer insulating film ILD2. The bridge pattern BRP may be connected to the first transistor electrode TE1 through a contact hole penetrating the second interlayer insulating film ILD2.

The passivation film PSV may be disposed on the second interlayer insulating film ILD2. The passivation film PSV may cover the bridge pattern BRP. The passivation film PSV may be provided in a form including an organic insulating film, an inorganic insulating film, or an organic insulating film disposed on an inorganic insulating film.

The passivation film PSV may include the first contact portion CNT1 connected to an area of the bridge pattern BRP. In some embodiments, although not shown in FIG. 8, a second contact portion CNT2 may be formed in the passivation film PSV.

The display element part DPL may include the first to eighth electrodes ELT1 to ELT8. However, herein, for better understanding and ease of description, the first electrode ELT1 and the second electrode ELT2 will be mainly described. In addition, the display element part DPL may include the light emitting element LD, but, herein, for better understanding and ease of description, the first light emitting element LDs1 will be described as an example.

The display element part DPL may include the first electrode ELT1, the second electrode ELT2, the first adjacent electrode AELT1, the second adjacent electrode AELT2, a bridge electrode 100, a first insulating film INS1, a second insulating film INS2, a third insulating film INS3, a fourth insulating film INS4, the first contact hole CH1, the second contact hole CH2, the bank pattern BNP, the first contact electrode CNE1, the second contact electrode CNE2, the first light emitting element LDs1, and the bank BNK.

The first electrode ELT1, the second electrode ELT2, the first adjacent electrode AELT1, and the second adjacent electrode AELT2 may be arranged on the passivation film PSV. In some embodiments, at least a portion of each of the first electrode ELT1 and the second electrode ELT2 may be arranged on the bank pattern BNP.

The first electrode ELT1 may be electrically connected to the bridge pattern BRP through the first contact portion CNT1, and may be provided with a first power source. Although not shown, the second electrode ELT2 may be provided with a second power source having a voltage different from that of the first power source through a wire (e.g., a predetermined wire).

At least a portion of each of the first electrode ELT1 and the second electrode ELT2 may be arranged on a surface of the bank pattern BNP. Accordingly, the first electrode ELT1 and the second electrode ELT2 reflect light emitted from the first light emitting element LDs1 in a display direction of the display device, thereby improving the light emitting efficiency of the first light emitting element LDs1. In this case, the display direction may refer to a third direction DR3.

At least a portion of the first insulating film INS1 may be disposed on the passivation film PSV, and another at least a portion of the first insulating film INS1 may be arranged on the first electrode ELT1, the second electrode ELT2, the first adjacent electrode AELT1, or the second adjacent electrode AELT2. The first insulating film INS1 may stabilize electrical connections to the first electrode ELT1, the second electrode ELT2, the first adjacent electrode AELT1, and the second adjacent electrode AELT2, and may attenuate external influences. In an embodiment, the first insulating film INS1 may include an inorganic material. For example, the first insulating film INS1 may include one of a silicon oxide (SiOx), a silicon nitride (SiNx), a silicon oxynitride (SiOxNy), an aluminum oxide (AlOx), and a titanium oxide (TiOx), but is not limited thereto.

The first contact hole CH1 and the second contact hole CH2 may be formed in the first insulating film INS1 and the second insulating film INS2, respectively. The first contact hole CH1 and the second contact hole CH2 may be formed to penetrate through the first insulating film INS1 and the second insulating film INS2.

The first contact hole CH1 may be a path through which the first contact electrode CNE1 and the first electrode ELT1 are connected. The second contact hole CH2 may be a path through which the second contact electrode CNE2 and the second electrode ELT2 are connected. The first contact hole CH1, the first electrode ELT1, and the first contact electrode CNE1 may overlap each other when viewed in a plan view.

The bridge electrode 100 may connect the second electrode ELT2 and the second contact electrode CNE2. At least a portion of the bridge electrode 100 may contact the second electrode ELT2, and another at least a portion of the bridge electrode 100 may contact the second contact electrode CNE2. At least a portion of the bridge electrode 100 may be provided in the second contact hole CH2. The bridge electrode 100, the second electrode ELT2, the second contact electrode CNE2, and the second contact hole CH2 may overlap each other when viewed in a plan view.

In an embodiment, the bridge electrode 100 may be formed at the same time as the first contact electrode CNE1. In an embodiment, the bridge electrode 100 may contain the same material as the first contact electrode CNE1.

The bank BNK may be a structure defining the light emitting area EMA of the pixel PXL. The light emitting area EMA may be an area from which light is emitted from the first light emitting element LDs1. For example, the bank BNK may be disposed to surround at least a portion of the first light emitting element LDs1 of the pixel PXL. The bank BNK may include at least one of an organic material and an inorganic material.

At least a portion of each of the first contact electrode CNE1 and the second contact electrode CNE2 may be arranged on the first insulating film INS1, and another at least a part thereof may be arranged on the second insulating film INS2.

The first contact electrode CNE1 may be electrically connected to the first electrode ELT1 through the first contact hole CH1, and the second contact electrode CNE2 may be electrically connected to the second electrode ELT2 through the second contact hole CH2. The first contact electrode CNE1 may be electrically connected to an end of the first light emitting element LDs1, and the second contact electrode CNE2 may be electrically connected to another end of the first light emitting element LDs1. As a result, an electrical signal provided through the first electrode ELT1 may be provided to the first light emitting element LDs1 through the first contact electrode CNE1, and an electrical signal provided through the second electrode ELT2 may be provided to the first light emitting element LDs1 through the second contact electrode CNE2.

The second contact electrode CNE2 may be connected to the second electrode ELT2 through the bridge electrode 100. That is, the electrical signal provided through the second electrode ELT2 may be provided to the second contact electrode CNE2 via the bridge electrode 100.

At least a part of the second insulating film INS2 may be arranged on the first light emitting element LDs1, and another at least a portion of the second insulating film INS2 may be arranged on the first insulating film INS1. In some embodiments, a portion of the second insulating film INS2 may be arranged on the bank BNK.

First, the second insulating film INS2 may cover the active layer 12 of the first light emitting element LDs1. A portion of the second insulating film INS2 is formed on a rear surface of the first light emitting element LDs1 to fill a gap between the first insulating film INS1 and the first light emitting element LDs1.

Another portion of the second insulating film INS2 may be arranged adjacent to a position at which the first contact hole CH1 is formed and/or a position at which the second contact hole CH2 is formed. For example, another portion of the second insulating film INS2 may be arranged to surround the first contact hole CH1 and/or the second contact hole CH2 when viewed in a plan view.

In an embodiment, the second insulating film INS2 may include an inorganic material. For example, the second insulating film INS2 may include one of the materials described with reference to the first insulating film INS1. However, the present invention is not limited thereto, and, in some embodiments, the second insulating film INS2 may include an organic material.

A portion of the third insulating film INS3 may be arranged between the first contact electrode CNE1 and the second contact electrode CNE2 on the first light emitting element LDs1. A portion of the third insulating film INS3 may be arranged between the first contact electrode CNE1 and the second contact electrode CNE2 to prevent or substantially prevent a short circuit between the first contact electrode CNE1 and the second contact electrode CNE2.

Another portion of the third insulating film INS3 may be arranged on the first contact electrode CNE1 to overlap the first contact hole CH1. Another portion of the third insulating film INS3 may be disposed adjacent to the second contact hole CH2. According to an embodiment, another portion of the third insulating film INS3 may be arranged on the second insulating film INS2 such that at least a portion of the bridge electrode 100 disposed adjacent to the second contact hole CH2 is exposed. In some embodiments, a portion of the third insulating film INS3 may be arranged on the bank BNK.

In an embodiment, the third insulating film INS3 may include an inorganic material, and, for example, may include one of the materials described with reference to the first insulating film INS1.

The fourth insulating film INS4 may cover the bank BNK, the first contact electrode CNE1, the second contact electrode CNE2, the second insulating film INS2, and the third insulating film INS3. The fourth insulating film INS4 may protect individual components of the display element part DPL from external influences. The fourth insulating film INS4 may include one of the materials described with reference to the first insulating film INS1, but is not limited to a specific example.

Although not shown in the drawing, in some embodiments, a planarization layer may be further provided on the fourth insulating film INS4. The planarization layer may lower a step caused by various components disposed under the planarization layer, and an upper surface of the planarization layer may be substantially flat. The planarization layer may include an organic insulating film, but is not limited thereto, and may further include an inorganic insulating film.

Herein, a manufacturing method of a display device according to an embodiment will be described with reference to FIGS. 9 to 21.

FIGS. 9 to 21 illustrate cross-sectional views of process steps of a manufacturing method of a display device according to an embodiment. In FIGS. 9 to 21, for better understanding and ease of description, the pixel circuit part PCL is schematically illustrated.

FIG. 9, FIG. 11, FIG. 13, FIG. 15, FIG. 17, and FIGS. 19 to 21 illustrate cross-sectional views of process steps of the manufacturing method for the cross-sectional structure taken along the line I-I' of FIG. 5, and mainly illustrate the arrangement area 300, the first open area 402, and the contact area 500.

FIG. 10, FIG. 12, FIG. 14, FIG. 16, and FIG. 18 illustrate cross-sectional views of process steps of the manufacturing method for the cross-sectional structure taken along the line II-II' of FIG. 5 and the cross-sectional structure taken along the line III-III' of FIG. 5, and mainly illustrate the second open area 404.

Figure 9:
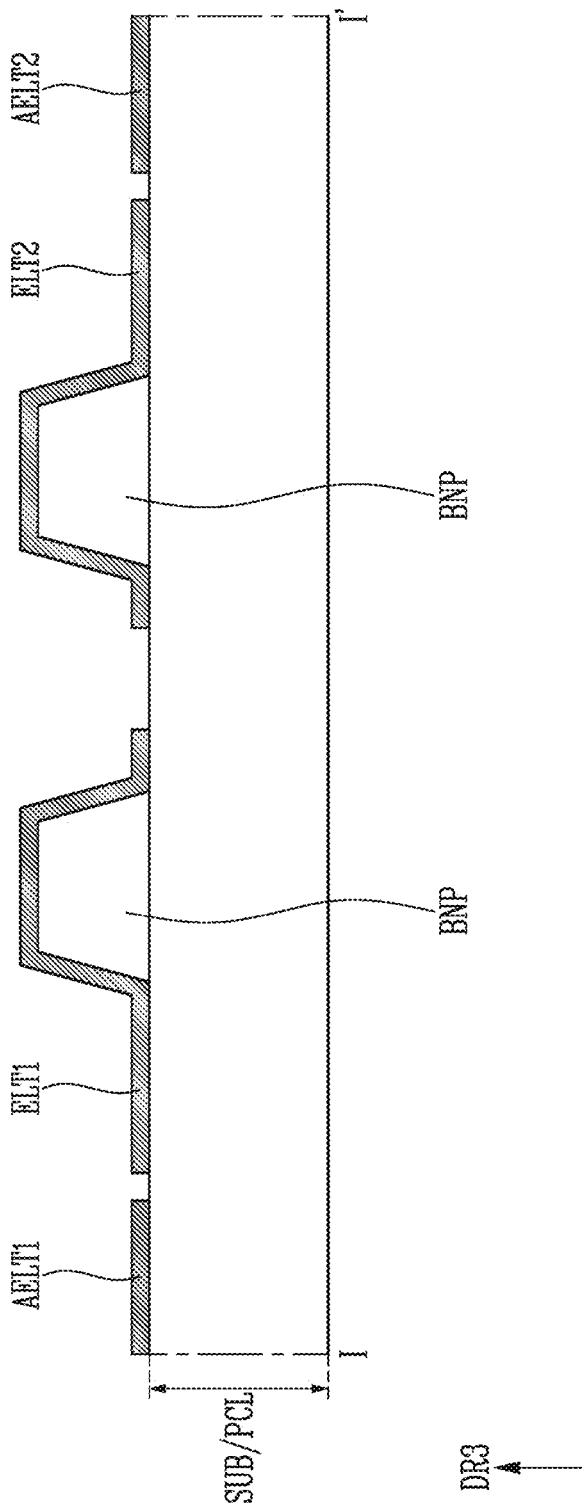
FIGS. 9 to 21 illustrate cross-sectional views of process steps of a manufacturing method of a display device according to an embodiment.
Figure 10:
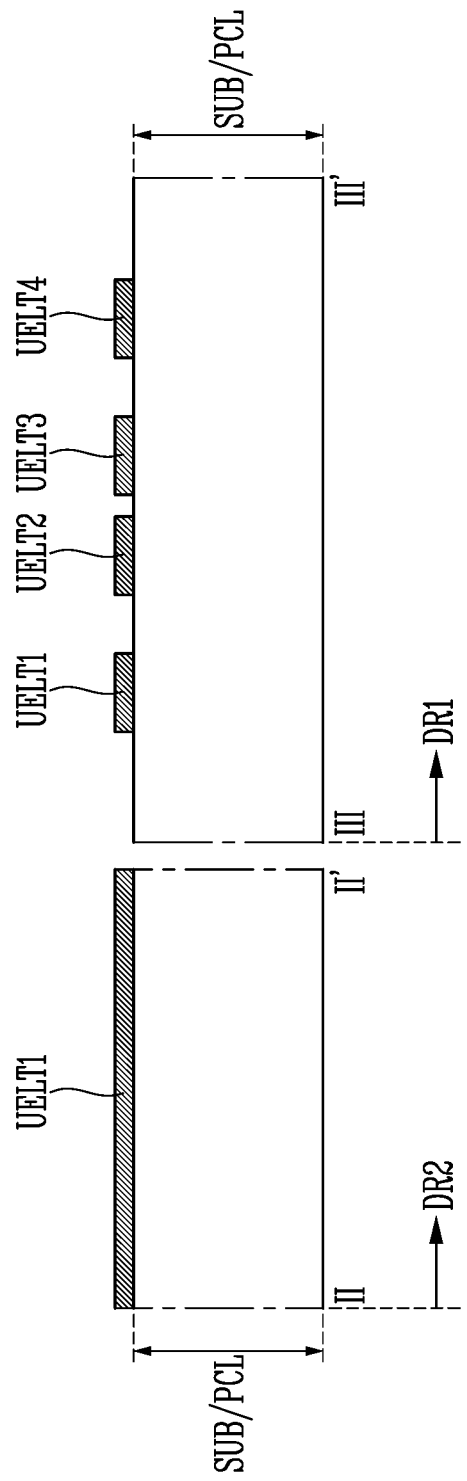

Referring to FIG. 9 and FIG. 10, the substrate SUB may be prepared, and the pixel circuit part PCL may be disposed on the substrate SUB.

Referring to FIG. 9, the bank pattern BNP may be formed on the pixel circuit part PCL in the arrangement area 300, and the first electrode ELT1, the second electrode ELT2, the first adjacent electrode AELT1, and the second adjacent electrode AELT2 may be formed on the pixel circuit part PCL. In this case, at least a portion of each of the first electrode ELT1 and the second electrode ELT2 may be provided on the bank pattern BNP. In an embodiment, although not shown in the drawing, configurations of the first electrode ELT1, the second electrode ELT2, the first adjacent electrode AELT1, and the second adjacent electrode AELT2 are formed on the pixel circuit part PCL by sputtering, and may be provided by performing an exposure process, a deposition process, and then performing an etching process along an area to be patterned.

Referring to FIG. 10, a first uncut electrode UELT1, a second uncut electrode UELT2, a third uncut electrode UELT3, and a fourth uncut electrode UELT4 may be formed on the pixel circuit part PCL in the second open area 404. In an embodiment, the first uncut electrode UELT1, the second uncut electrode UELT2, the third uncut electrode UELT3, and the fourth uncut electrode UELT4 may be formed at the same time as the first to eighth electrodes ELT1 to ELT8.

The first uncut electrode UELT1, the second uncut electrode UELT2, the third uncut electrode UELT3, and the fourth uncut electrode UELT4 may extend in the second direction DR2, and may be spaced apart from each other in the first direction DR1.

In this case, an end of the first uncut electrode UELT1 may be connected to the first electrode ELT1 described above with reference to FIG. 9, and another end of the first uncut electrode UELT1 may be connected to the third electrode ELT3 described above with reference to FIG. 5. As subsequent processing is performed, at least a portion of the first uncut electrode UELT1 is removed (or cut), such that the first electrode ELT1 and the third electrode ELT3 may be separated from each other. Likewise, an end of the second uncut electrode UELT2 may be connected to the second electrode ELT2, and another end of the second uncut electrode UELT2 may be connected to the fourth electrode ELT4. At least a portion of the second uncut electrode UELT2 is removed, such that the second electrode ELT2 and the fourth electrode ELT4 may be separated from each other. An end of the third uncut electrode UELT3 may be connected to the sixth electrode ELT6, and another end of the third uncut electrode UELT3 may be connected to the eighth electrode ELT8. At least a portion of the third uncut electrode UELT3 is removed, such that the sixth electrode ELT6 and the eighth electrode ELT8 may be separated from each other. An end of the fourth uncut electrode UELT4 may be connected to the fifth electrode ELT5, and another end of the fourth uncut electrode UELT4 may be connected to the seventh electrode ELT7. At least a portion of the fourth uncut electrode UELT4 is removed, such that the fifth electrode ELT5 and the seventh electrode ELT7 may be separated from each other.

Figure 11:
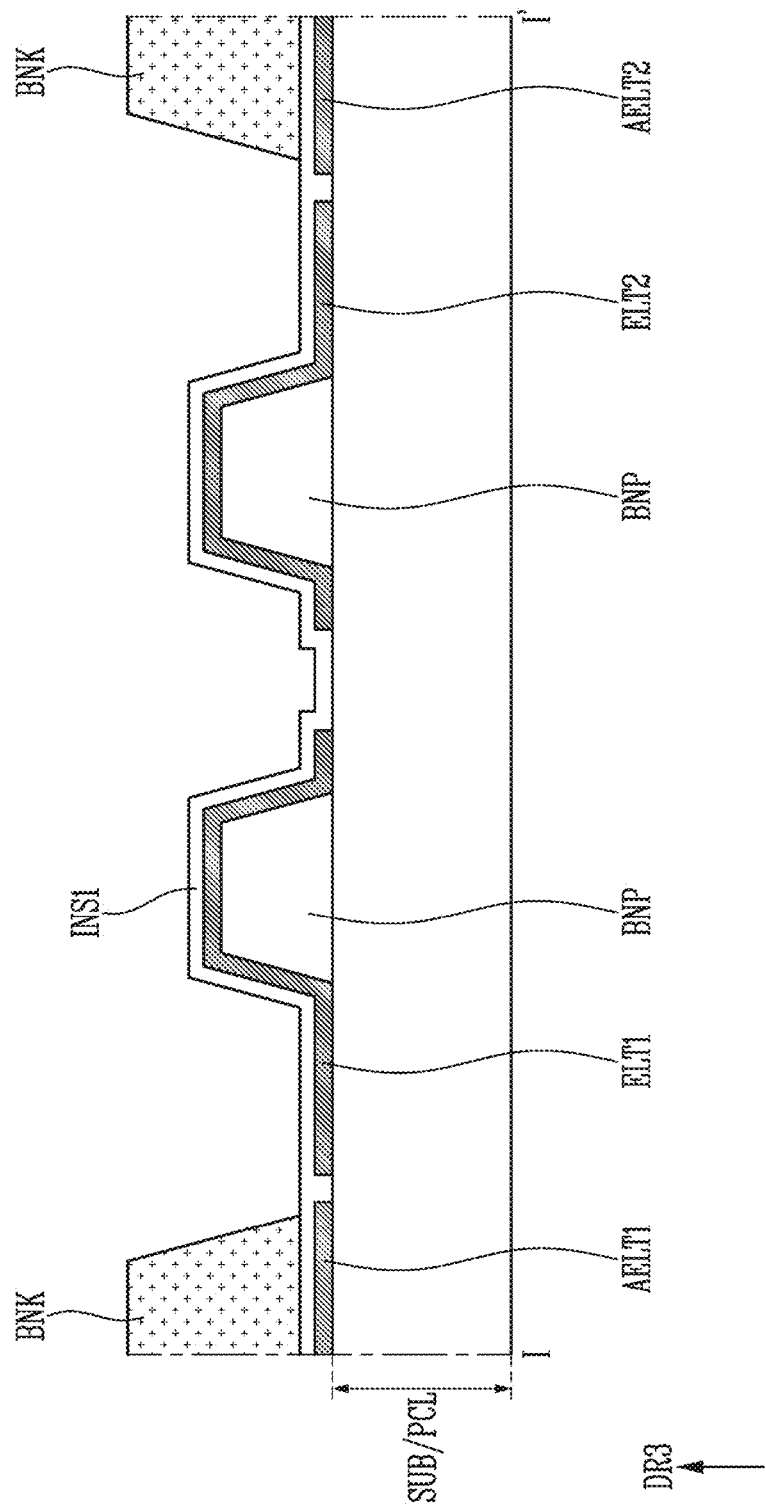
Figure 12:
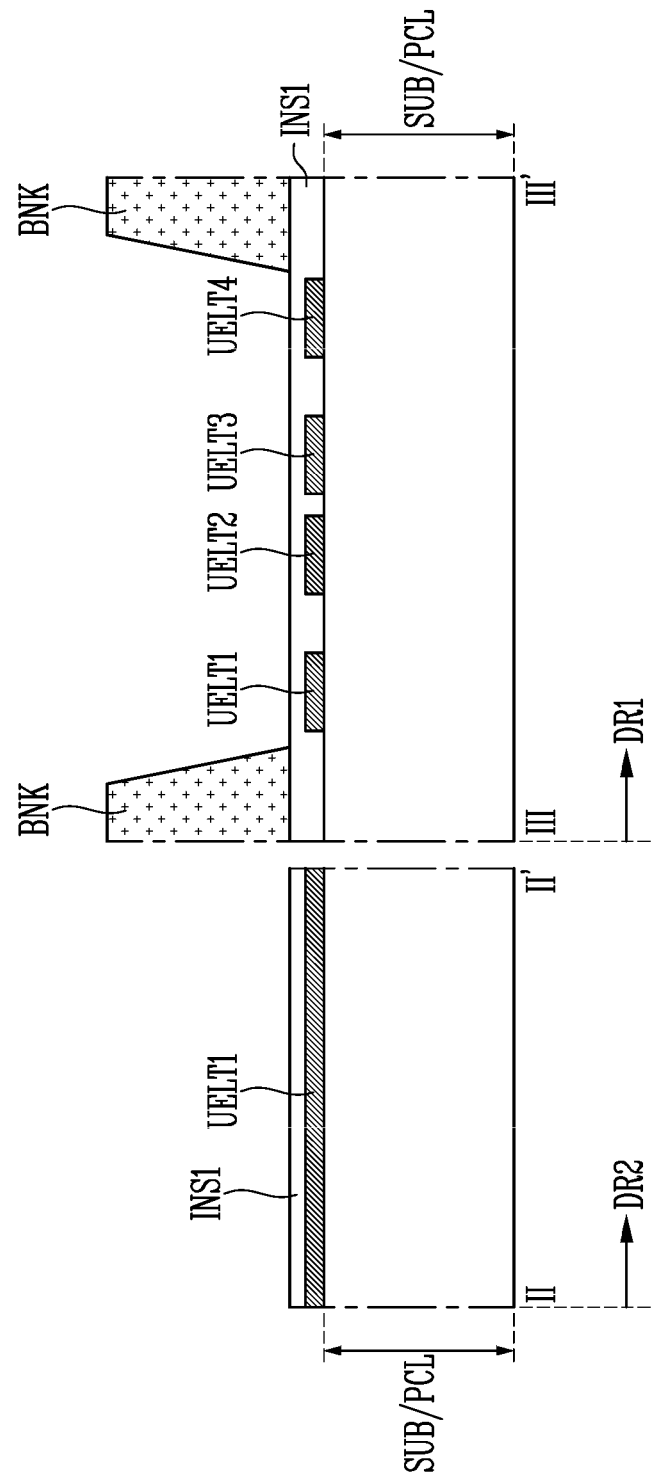

Referring to FIGS. 11 and 12, the first insulating film INS1 may be provided. The first insulating film INS1 may be deposited to cover the first electrode ELT1, the second electrode ELT2, the first adjacent electrode AELT1, the second adjacent electrode AELT2, the first uncut electrode UELT1, the second uncut electrode UELT2, the third uncut electrode UELT3, and the fourth uncut electrode UELT4. Next, the bank BNK may be formed on the first insulating film INS1. The bank BNK may be formed, such that the light emitting area EMA may be defined.

Figure 13:
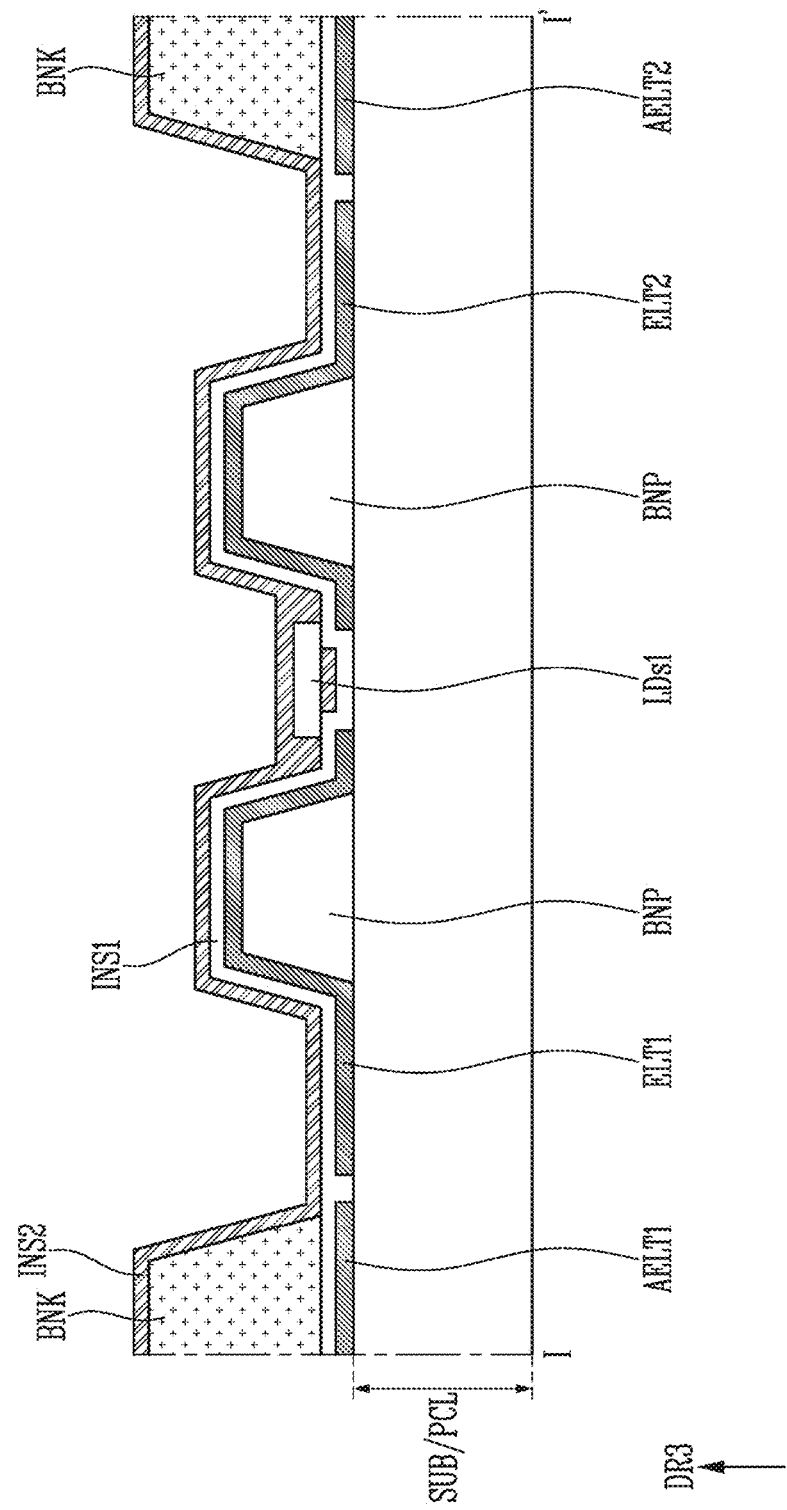
Figure 14:
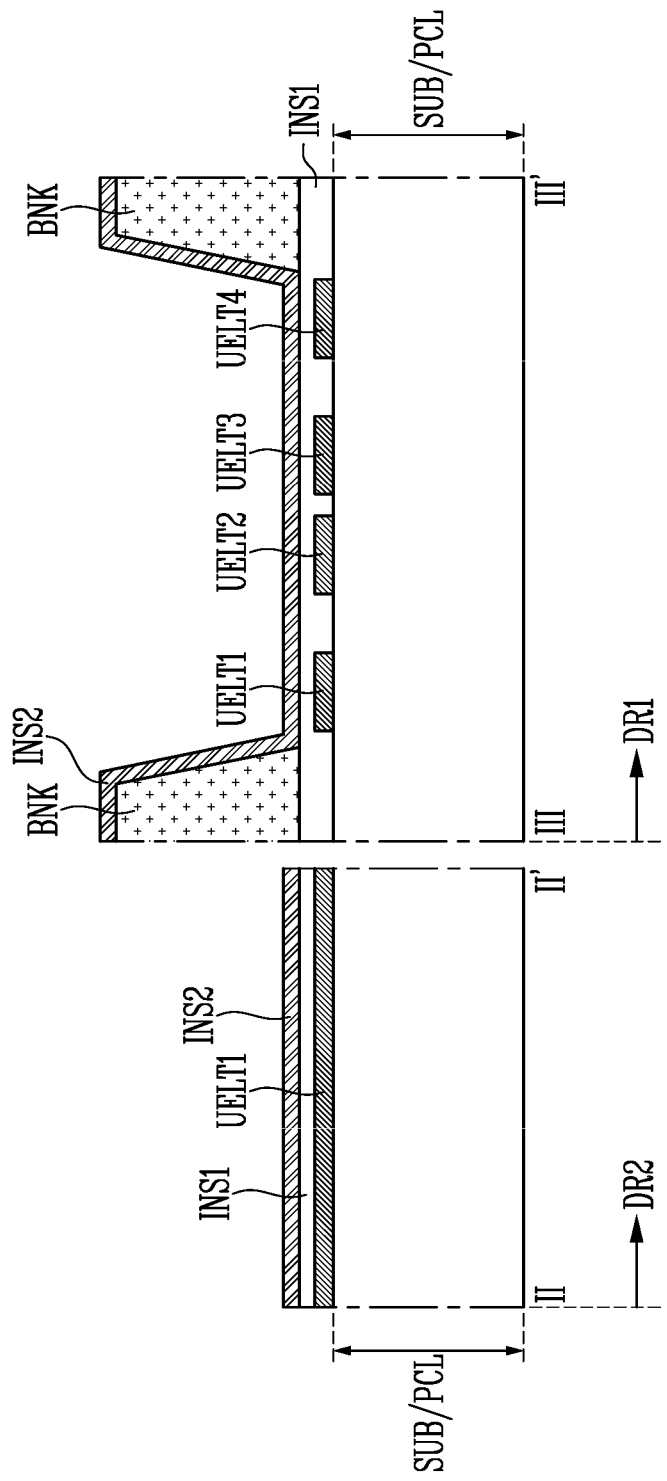

Referring to FIGS. 13 and 14, the first light emitting element LDs1 may be arranged, and the second insulating film INS2 may be provided. The second insulating film INS2 may be deposited to cover the first insulating film INS1 and the bank BNK. The second insulating film INS2 may be formed on the first light emitting element LDs1 to at least cover the active layer 12 of the first light emitting element LDs1.

In an embodiment, although not shown in the drawing, the first light emitting element LDs1 may be prepared by being dispersed (or provided or included) in a solvent included in an ink. The ink including the first light emitting element LDs1 may be provided to the display device according to an embodiment by a printing device configured to inject the ink. In this case, the ink may be provided in the light emitting area EMA. For example, referring to FIG. 5, it may be discharged in an area surrounded by the bank BNK.

Figure 15:
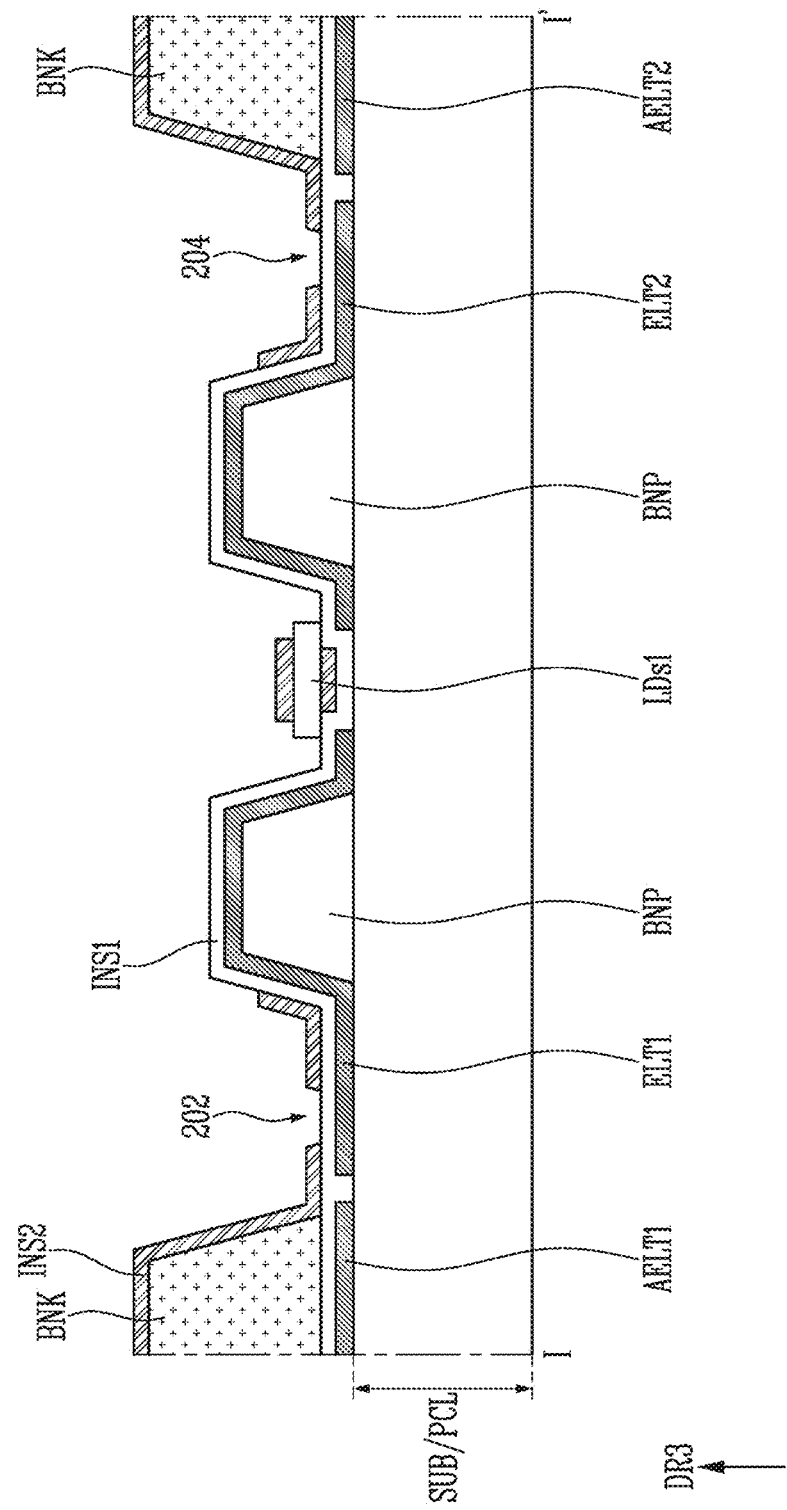
Figure 16:
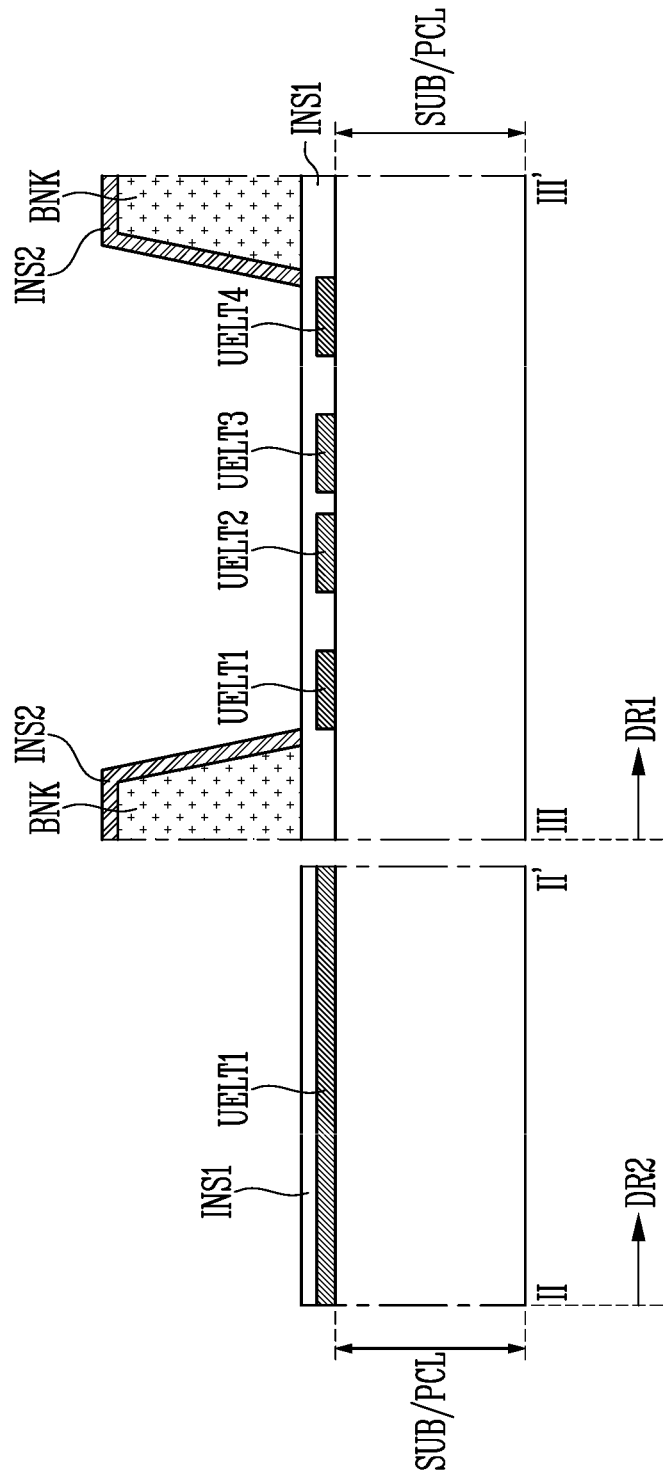

Referring to FIGS. 15 and 16, at least a portion of the second insulating film INS2 may be removed. In an embodiment, a portion of the second insulating film INS2 may be etched (for example, dry-etched) to provide a first hole 202 and a second hole 204, and a first end and a second end of the first light emitting element LDs1 may be exposed. The first hole 202 and the second hole 204 may respectively expose the first insulating film INS1. The first hole 202 may correspond to a position at which the first contact hole CH1 is to be provided as a later process is performed, and the second hole 204 may correspond to a position at which the second contact hole CH2 is to be provided as a later process is performed.

In the accompanying drawings, although it is shown that the second insulating film INS2 arranged on the bank BNK is not etched, the present invention is not limited thereto, and, in some embodiments, the second insulating film INS2 arranged on the bank BNK may be removed during the present process.

Figure 17:
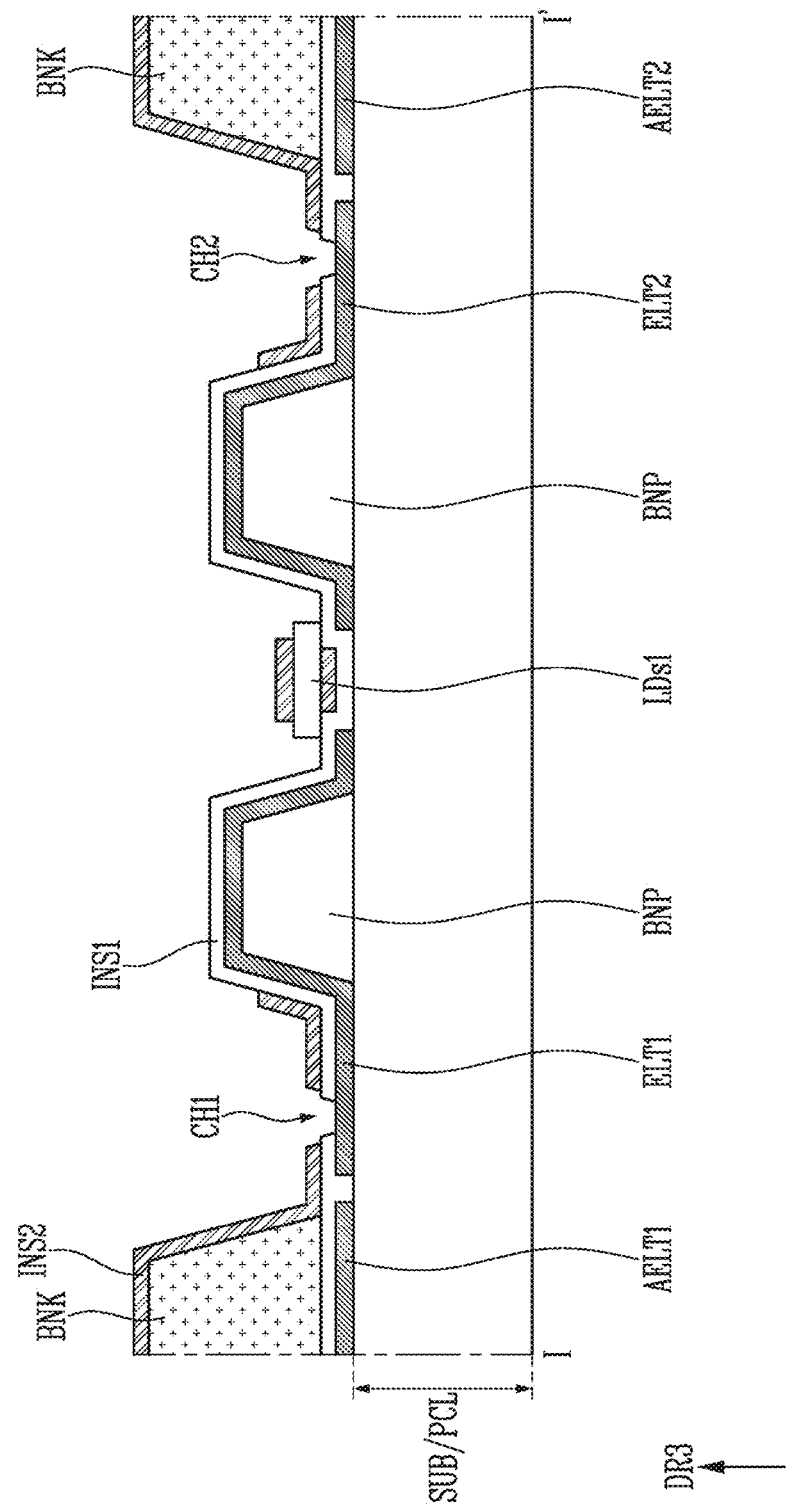
Figure 18:
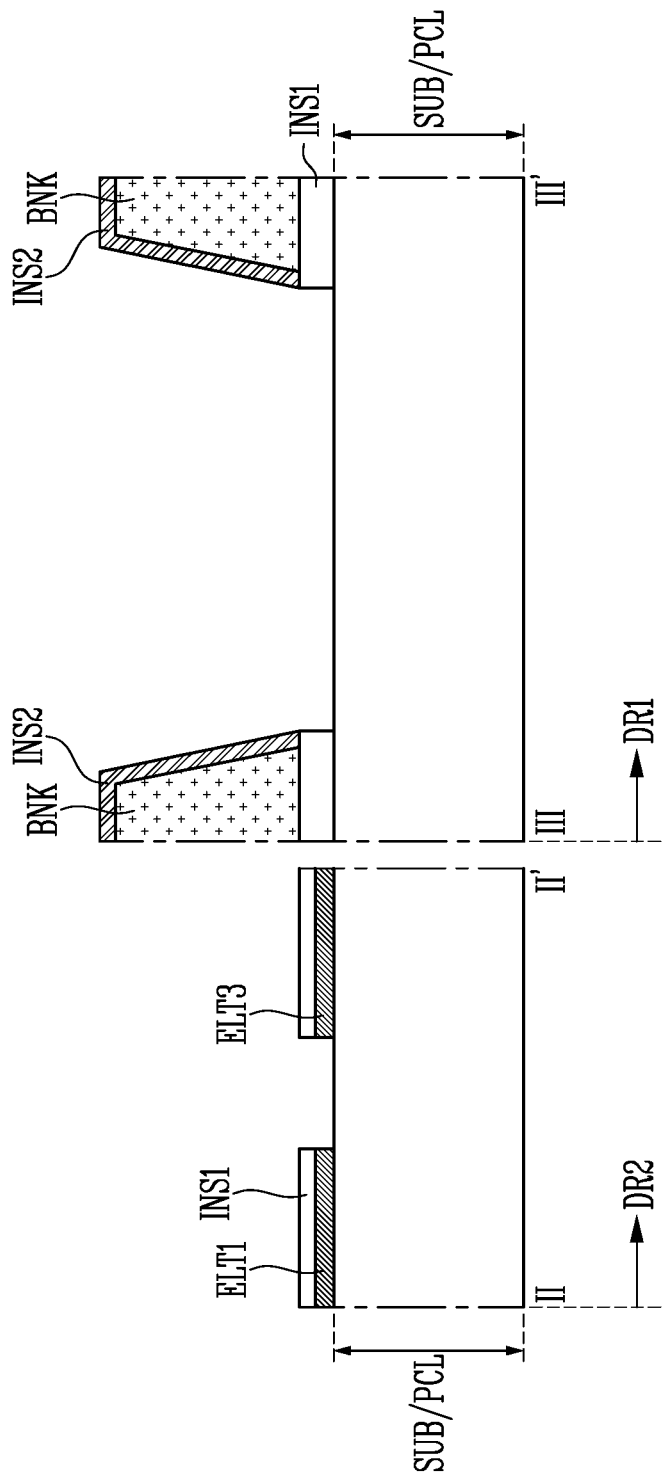

Referring to FIGS. 17 and 18, at least a portion of the first insulating film INS1 may be removed. In an embodiment, a portion of the first insulating film INS1 may be etched (for example, dry-etched) to provide the first contact hole CH1 and the second contact hole CH2.

Meanwhile, referring to FIG. 18, in the second open area 404, the first insulating film INS1 is removed, and at least a portion of each of the first uncut electrode UELT1, the second uncut electrode UELT2, the third uncut electrode UELT3, and the fourth uncut electrode UELT4 may be removed. According to an example, a wet-etching process may be performed, but embodiments are not limited thereto.

At least a portion of the first uncut electrode UELT1 may be removed (or cut) to provide the first electrode ELT1 and the third electrode ELT3 spaced apart from each other in the second direction DR2. In addition, although not shown in the drawing, at least a portion of the second uncut electrode UELT2 may be removed to provide the second electrode ELT2 and the fourth electrode ELT4 spaced apart from each other in second direction DR2. At least a portion of the third uncut electrode UELT3 may be removed to provide the sixth electrode ELT6 and the eighth electrode ELT8 spaced apart from each other in the second direction DR2. At least a portion of the fourth uncut electrode UELT4 is removed to provide the fifth electrode ELT5 and the seventh electrode ELT7 spaced apart from each other in the second direction DR2.

In an embodiment, the etching process for providing the first contact hole CH1 and the second contact hole CH2 and the etching process for removing at least a portion of each of the first to fourth uncut electrodes UELT1 to UELT4 are performed by using the same mask. Accordingly, since the above-described etching processes are performed in a single process rather than separate processes, the number of masks may be reduced, and, thus, a process cost may be reduced.

In addition, referring to FIG. 17 together with FIG. 13, the process of forming the first contact hole CH1 and the second contact hole CH2 may be performed after the light emitting element LD is arranged. That is, the process of providing the ink including the light emitting element LD may be performed before the first electrode ELT1 and/or the second electrode ELT2 are exposed, and, accordingly, since the arrangement area 300 and the contact area 500 are areas surrounded by the bank BNK, even when they are arranged adjacent to each other, misalignment of the light emitting elements LD may be prevented or substantially prevented. For example, at least some of the light emitting elements LD may have polarity, and the light emitting elements LD having polarity may be arranged in the arrangement area 300 by electrical information formed between the first electrode ELT1 and the second electrode ELT2. That is, when an electrode configuration that may affect the orientation and/or motion of the light emitting element LD is exposed in an area adjacent to the arrangement area 300, misalignment of the light emitting element LD may occur. However, as described above, the process of providing the ink including the light emitting element LD is performed before the first electrode ELT1 and/or the second electrode ELT2 are exposed, thereby preventing or substantially preventing misalignment of the light emitting element LD.

In addition, referring to FIG. 18 together with FIG. 13, a process of removing at least some of the first to fourth uncut electrodes UELT1 to UELT4 may be performed after the light emitting element LD is arranged. That is, the process of providing the ink including the light emitting element LD may be performed before some electrode components are exposed as at least a portion of each of the first to fourth uncut electrodes UELT1 to UELT4 is removed, and, accordingly, since the arrangement area 300 and the open area 400 are areas surrounded by the bank BNK, even when they are arranged adjacent to each other, misalignment of the light emitting element LD may be prevented or substantially prevented.

Herein, a subsequent process for the arrangement area 300 and the contact area 500 will be described.

Figure 19:
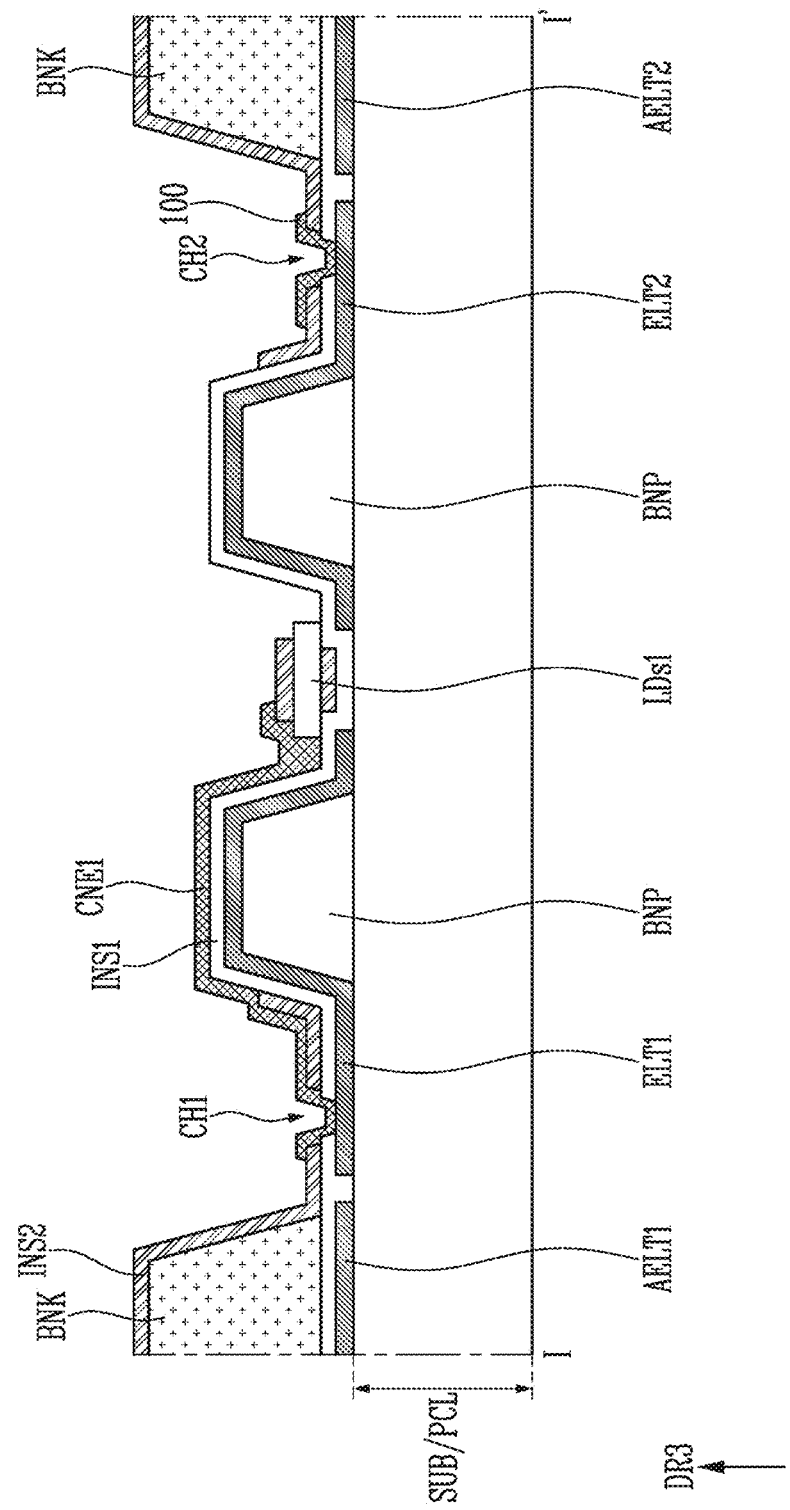

Referring to FIG. 19, the first contact electrode CNE1 and the bridge electrode 100 may be formed. In an embodiment, the first contact electrode CNE1 and the bridge electrode 100 may be patterned at the same time. In an embodiment, the first contact electrode CNE1 and the bridge electrode 100 may contain the same material.

At least a portion of the first contact electrode CNE1 may be electrically connected to the first electrode ELT1 through the first contact hole CH1, and another at least a portion of the first contact electrode CNE1 may be electrically connected to a portion of the first light emitting element LDs1.

The bridge electrode 100 may overlap the second contact hole CH2 when viewed in a plan view. The bridge electrode 100 may be provided in the second contact hole CH2. The bridge electrode 100 may be electrically connected to the second electrode ELT2.

Figure 20:
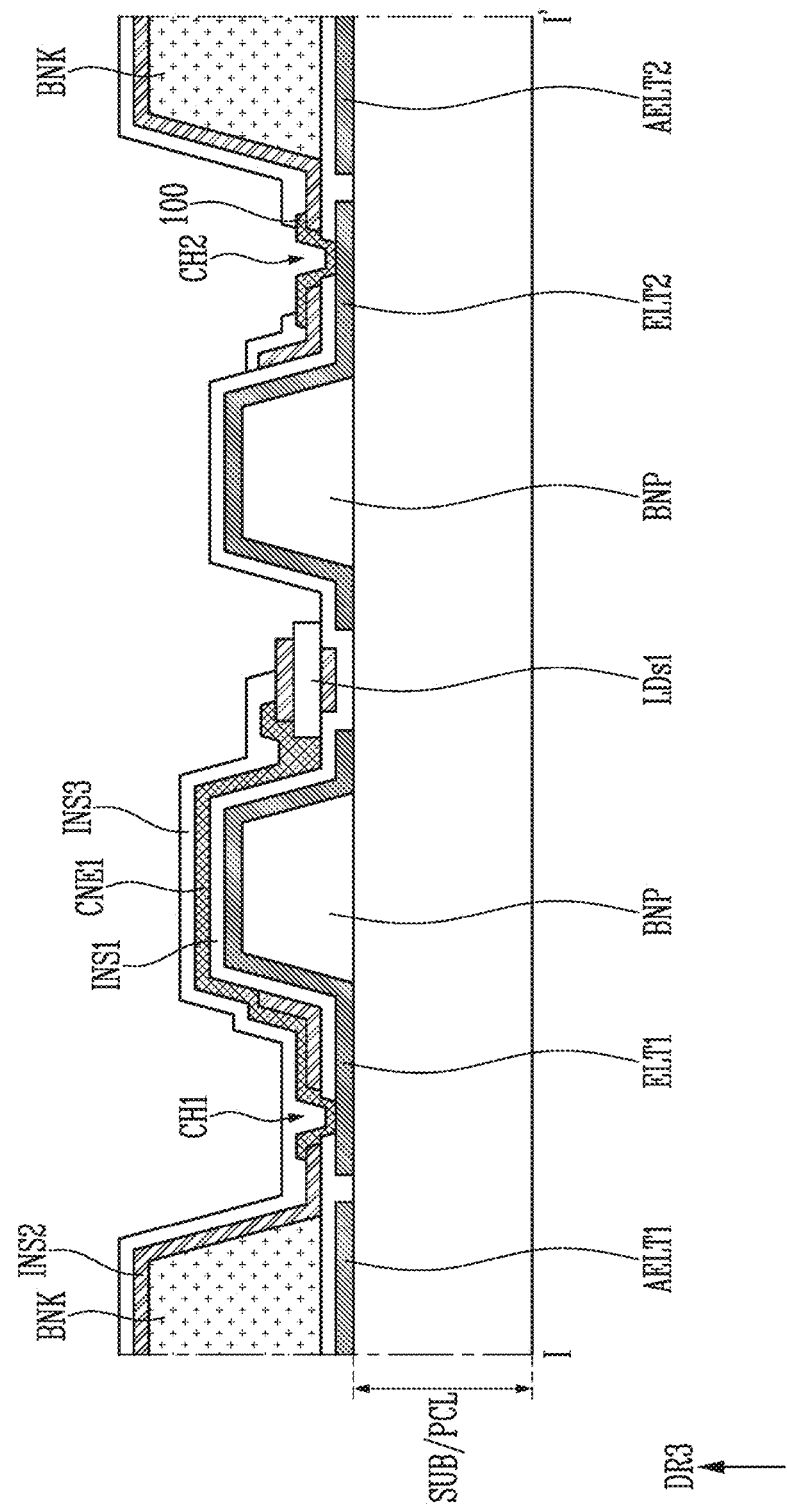

Referring to FIG. 20, the third insulating film INS3 may be arranged to at least cover the first contact electrode CNE1. In some embodiments, the third insulating film INS3 may be arranged on the second insulating film INS2.

At least a portion of the third insulating film INS3 may be arranged adjacent to the second contact hole CH2. The third insulating film INS3 may be arranged such that at least a portion of the bridge electrode 100 is exposed. In some embodiments, the third insulating film INS3 may be arranged to not overlap the second contact hole CH2, or arranged to overlap the second contact hole CH2, but not overlap at least a portion of the bridge electrode 100.

Figure 21:
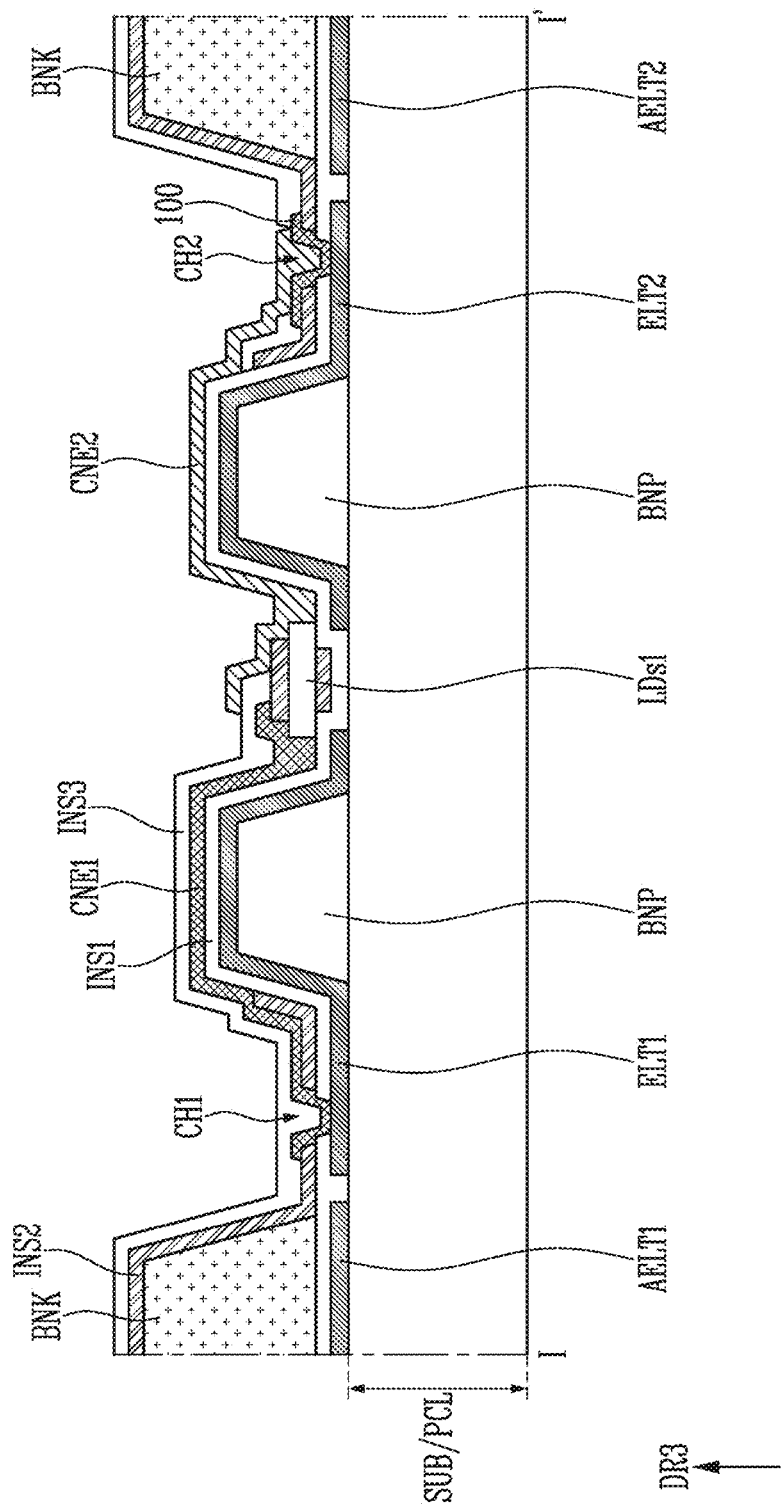

Referring to FIG. 21, the second contact electrode CNE2 may be formed. At least a portion of the second contact electrode CNE2 may be electrically connected to the first light emitting element LDs1, and another at least a portion of the second contact electrode CNE2 may be electrically connected to the second electrode ELT2 through the bridge electrode 100. That is, an electrical signal provided through the second electrode ELT2 may be provided to the first light emitting element LDs1 through the bridge electrode 100 and the second contact electrode CNE2. According to an embodiment, when viewed in a plan view, the second contact electrode CNE2, the bridge electrode 100, and the second electrode ELT2 may overlap each other.

Next, although not shown in the drawing, the fourth insulating film INS4 and the planarization layer may be formed, and the fourth insulating film INS4 and the planarization layer may protect the display device according to an embodiment from external influences.

According to the present embodiment, the ink including the light emitting element LD may be provided in an area surrounded by the bank BNK. That is, a target area in which the process of providing the ink is performed is an area in which the bank BNK is not arranged, and may include the arrangement area 300, the open area 400, and the contact area 500. Therefore, according to an embodiment, when performing the process for providing the ink including the light emitting element LD, the area in which the ink may be provided may be expanded. Accordingly, a ratio at which the light emitting elements LD are normally arranged is increased, thereby improving the process efficiency.

In addition, according to an embodiment, since the process of cutting the electrode configuration (for example, the first to fourth uncut electrodes UELT1 to UELT4) and the process of forming the contact hole (for example, the first contact hole CH1 and the second contact hole CH2) to form the pixel electrode, may be performed after the process of providing the ink including the light emitting element LD, even when the ink is provided in an area including the open area 400 and the contact area 500, which are areas surrounded by the bank BNK, misalignment of the light-emitting element LD included in the ink may be prevented or substantially prevented.

The above description is merely illustrative of the technical spirit and scope of the present invention, and a person of ordinary skill in the art will readily appreciate that various modifications and equivalent arrangements are possible without materially departing from the novel teachings, aspects, and advantages of the present invention. Further, the embodiments of the present invention described above may be implemented separately or in combination with each other.

Therefore, the embodiments disclosed in the present invention are not intended to limit the technical spirit or scope of the present invention, but to explain them, and the technical spirit and scope of the present invention is not limited by the described embodiments. The protected range of the present invention should be construed by the claims, and all technical ideas within an equivalent range should be construed as being included within the scope of the present invention.

What is claimed is:

1. A display device comprising:
    a substrate comprising a light emitting area and a non-light emitting area;
    a first electrode and a second electrode on the substrate;
    a light emitting element on the light emitting area of the substrate and configured to emit light in a display direction;
    a first insulating film covering at least a portion of each of the first electrode and the second electrode;
    a first contact electrode and a second contact electrode electrically connected to the light emitting element; and
    a bank on the non-light emitting area of the substrate and protruding in the display direction,
    wherein at least a portion of the light emitting area is surrounded by the non-light emitting area, and the light emitting area comprises an open area and a contact area,
    the first electrode and the first contact electrode are electrically connected within the contact area,
    the second electrode and the second contact electrode are electrically connected within the contact area,
    an end portion of the first electrode and an end portion of the second electrode are located within the open area,
    the first insulating film includes an insulating end portion formed in the open area, and
    the end portion of the first electrode and the insulating end portion are overlapped along the display direction in the open area.

2. The display device of claim 1, further comprising a bridge electrode electrically connecting the second contact electrode and the second electrode,
    wherein the first insulating film and the first electrode contact each other.

3. The display device of claim 2, wherein the bridge electrode comprises a same material as the first contact electrode.

4. A display device comprising:
    a substrate comprising a light emitting area and a non-light emitting area;
    a first electrode and a second electrode on the substrate;
    a light emitting element on the light emitting area of the substrate and configured to emit light in a display direction;
    a first contact electrode and a second contact electrode electrically connected to the light emitting element;
    a bank on the non-light emitting area of the substrate and protruding in the display direction;
    a bridge electrode electrically connecting the second contact electrode and the second electrode;
    a first insulating film covering at least a portion of each of the first electrode and the second electrode; and
    a first contact hole and a second contact hole penetrating the first insulating film in the contact area,
    wherein at least a portion of the light emitting area is surrounded by the non-light emitting area, and the light emitting area comprises an open area and a contact area,
    the first electrode and the first contact electrode are electrically connected within the contact area,
    the second electrode and the second contact electrode are electrically connected within the contact area,
    an end portion of the first electrode and an end portion of the second electrode are located within the open area, and
    in a plan view, the first contact electrode, the first contact hole, and the first electrode overlap each other, and the second contact electrode, the second contact hole, the bridge electrode, and the second electrode overlap each other.

5. The display device of claim 4, further comprising a second insulating film of which at least a portion is on the first insulating film,
    wherein the at least the portion of the second insulating film surrounds the second contact hole when viewed in a plan view, and is covered by the bridge electrode.

* * * * *